(12) United States Patent
Ohara et al.

(10) Patent No.: US 7,463,117 B2
(45) Date of Patent: Dec. 9, 2008

(54) FILM BULK ACOUSTIC-WAVE RESONATOR (FBAR), FILTER IMPLEMENTED BY FBARS AND METHOD FOR MANUFACTURING FBAR

(75) Inventors: Ryoichi Ohara, Kawasaki (JP); Naoko Yanase, Kawasaki (JP); Kazuhiko Itaya, Yokohama (JP); Kenya Sano, Kawasaki (JP); Takaaki Yasumoto, Kawasaki (JP); Kazuhide Abe, Kawasaki (JP); Toshihiko Nagano, Kawasaki (JP); Michihiko Nishigaki, Kawasaki (JP); Takashi Kawakubo, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 159 days.

(21) Appl. No.: 11/169,645

(22) Filed: Jun. 30, 2005

(65) Prior Publication Data

US 2006/0001508 A1    Jan. 5, 2006

(30) Foreign Application Priority Data

Jun. 30, 2004    (JP)    ............... 2004-194380

(51) Int. Cl.
*H03H 9/13* (2006.01)
*H03H 9/15* (2006.01)
*H03H 9/54* (2006.01)

(52) U.S. Cl. .............. 333/187; 333/189; 310/324; 310/364

(58) Field of Classification Search ........... 333/187, 333/189; 310/322, 324, 363, 364
See application file for complete search history.

(56) References Cited

U.S. PATENT DOCUMENTS

| 5,587,620 A | 12/1996 | Ruby et al. | |
|---|---|---|---|
| 7,002,437 B2 * | 2/2006 | Takeuchi et al. | 333/187 |
| 2004/0185594 A1 * | 9/2004 | Nishihara et al. | 438/53 |
| 2004/0189423 A1 * | 9/2004 | Loebl et al. | 333/187 |
| 2005/0035829 A1 * | 2/2005 | Umeda et al. | 333/191 |
| 2005/0093157 A1 * | 5/2005 | Noguchi et al. | 257/753 |
| 2005/0184627 A1 * | 8/2005 | Sano et al. | 310/363 |
| 2005/0191792 A1 * | 9/2005 | Noguchi et al. | 438/118 |

FOREIGN PATENT DOCUMENTS

| EP | 1 124 328 A1 * | 8/2001 |
|---|---|---|
| JP | 2000-69594 | 3/2000 |
| JP | 2001-156582 | 6/2001 |
| JP | 2001-274650 | 10/2001 |
| JP | 2001-313535 | 11/2001 |

(Continued)

OTHER PUBLICATIONS

T. Yokoyama, et al. "New Electrode Material for Low-Loss and High-Q FBAR Filters", 2004 IEEE Ultrasonic Symposium, Aug. 23-27, 2004, vol. 1, pp. 429-432.

(Continued)

*Primary Examiner*—Barbara Summons
(74) *Attorney, Agent, or Firm*—Oblon, Spivak, McClelland, Maier & Neustadt, P.C.

(57) ABSTRACT

A film bulk acoustic-wave resonator encompasses a substrate having a cavity; a bottom electrode partially fixed to the substrate, part of the bottom electrode is mechanically suspended above the cavity; a piezoelectric layer provided on the bottom electrode; and a top electrode provided on the piezoelectric layer having crystal axes oriented along a thickness direction of the piezoelectric layer, a full width at half maximum of the distribution of the orientations of the crystal axes is smaller than or equal to about six degrees.

11 Claims, 15 Drawing Sheets

FOREIGN PATENT DOCUMENTS

| | | | |
|---|---|---|---|
| JP | 2001-326553 | | 11/2001 |
| JP | 2002-141483 | | 5/2002 |
| JP | 2003-163566 | | 6/2003 |
| JP | 2003-198319 | | 7/2003 |
| JP | 2003-204239 | | 7/2003 |
| JP | 2004-95843 | | 3/2004 |
| WO | WO 03/017481 | * | 2/2003 |

OTHER PUBLICATIONS

U.S. Appl. No. 11/043,257, filed Jan. 27, 2005, Kenya Sano, et al.
U.S. Appl. No. 11/108,671, filed Apr. 19, 2005, Kenya Sano, et al.
U.S. Appl. No. 11/115,158, filed Jan. 27, 2005, Kazuhiko Itaya, et al.
U.S. Appl. No. 10/890,989, filed Jul. 15, 2004, Yasuo Ebuchi, et al.
U.S. Appl. No. 11/671,206, filed Feb. 5, 2007, Ohara, et al.
U.S. Appl. No. 11/761,767, filed Jun. 12, 2007, Sano, et al.

* cited by examiner

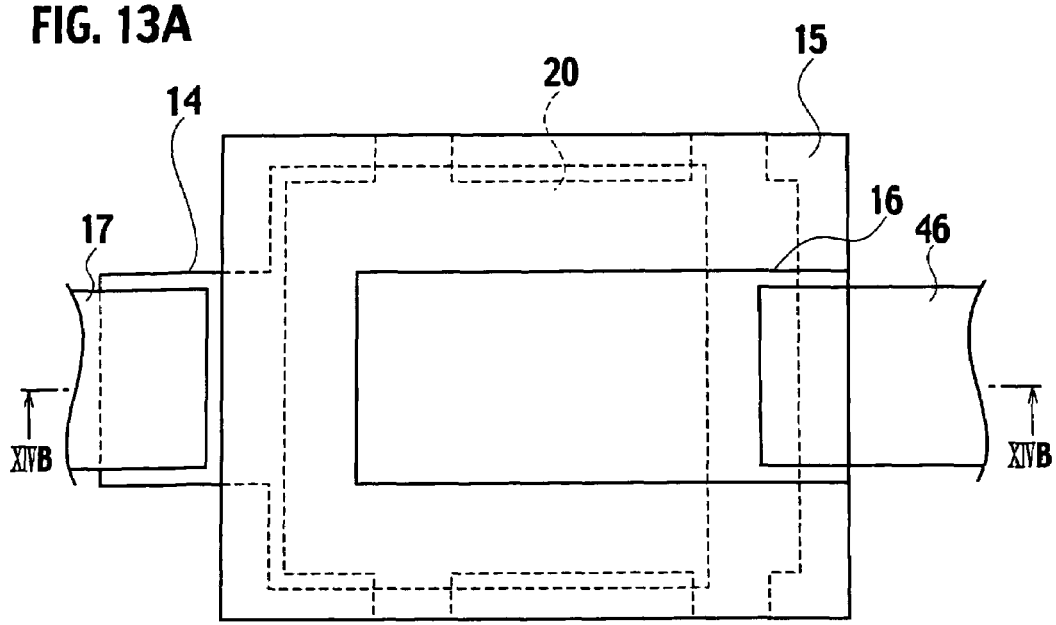
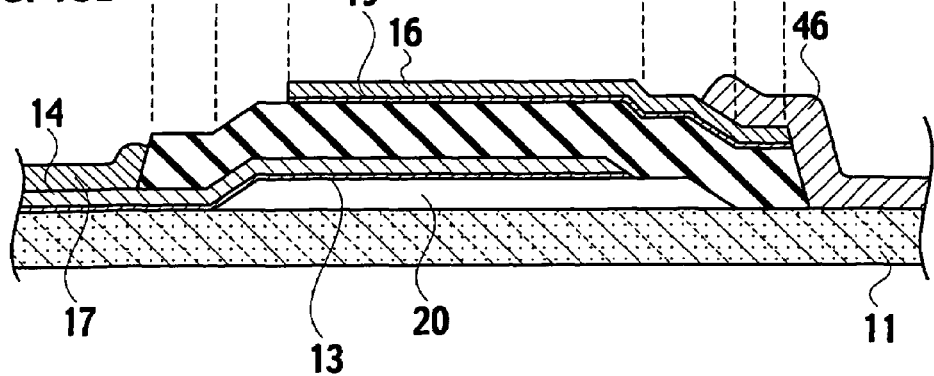

FILM BULK ACOUSTIC-WAVE RESONATOR (FBAR), FILTER IMPLEMENTED BY FBARS AND METHOD FOR MANUFACTURING FBAR

CROSS REFERENCE TO RELATED APPLICATIONS AND INCORPORATION BY REFERENCE

This application claims benefit of priority under 35 USC 119 based on Japanese Patent Application No. P2004-194380 filed Jun. 30, 2004 the entire contents of which are incorporated by reference herein.

BACKGROUND OF THE INVENTION

1. Field of the Invention

The present invention relates to a film bulk acoustic-wave resonator (FBAR) using a longitudinal vibration mode along a thickness direction of a piezoelectric layer, a filter implemented by a plurality of FBARs, and a method for manufacturing the FBAR.

2. Description of the Related Art

As recent wireless communication technology makes rapid developments and new architectures in wireless communication systems are employed one after another, there is a greater demand for communication devices that are compatible with a plurality of different communication systems. In addition, because the move to higher performance and higher function of mobile terminals increases to an extraordinary number of components, further miniaturization and module configuration of the components are required more and more. And since a filter circuit especially occupies a large volume among various passive components used in a wireless communication circuit, filters must be miniaturized and be merged into a module, so that the wireless communication circuit may be miniaturized and the number of the components may be decreased.

LC filters, dielectric filters and surface acoustic wave (SAW) filters are used in mobile communication devices of earlier technology. The LC filter and the dielectric filter, however, are difficult to be miniaturized and thinned. Especially a coil (inductor) used in the LC filter is difficult to be miniaturized. Further, since resistance losses must be considered in the coil (inductor), a LC filter having a sharp filter characteristic, cannot be realized. Therefore, the SAW filter is used as RF filters and IF filters in mobile communication devices. However, since the resonance frequency of the SAW device is inversely proportional to a space between comb-type electrodes, in a frequency band exceeding one GHz, the space between comb-type electrodes becomes 1 micrometer or less. Therefore, it is difficult to meet the demand of higher frequency of operation, as the frequency increases higher and higher recently. And such configuration using the SAW device needs fundamentally specific components, for instance, special substrates such as lithium tantalate ($LiTaO_3$), which is not suitable for miniaturization.

For a substitute of the SAW device, a resonator which has attracted attention recently is a FBAR using a longitudinal vibration mode along a thickness direction of a piezoelectric layer. The FBAR is called "bulk acoustic wave (BAW)" device, etc. A representative structure of the FBAR of earlier technology is disclosed in Japanese Published Unexamined Patent Application No. 2000-69594. As shown in the Japanese Published Unexamined Patent Application No. 2000-69594, the FBAR is manufactured by the following formation process sequences. First, a cavity is formed on a Si substrate by anisotropic etching, and next, a sacrificial layer, which is easily etched by a specific etchant, for instance, boro-phosphate-silicateglass (BPSG), is buried in the cavity at the top surface of the substrate. Afterwards, the sacrificial layer is polished flat until a top surface of the Si substrate comes into view. By the process, the sacrificial layer is embedded in the cavity at the top surface of the Si substrate and the top surface of the Si substrate surrounds the perimeter of the sacrificial layer while the top surface of the Si substrate being bare. On the sacrificial layer, a bottom electrode, a piezoelectric layer and a top electrode are deposited successively. Afterwards, an etchant supplying conduit is excavated until the etchant supplying conduit reaches the top surface of the sacrificial layer. Then, the sacrificial layer is removed by selective etching by the etchant supplied through the etchant supplying conduit, and a cavity is selectively formed under the bottom electrode. By such a sequence of formation processes, the FBAR is completed. Because, the filter implemented by a plurality of FBARs utilizes a longitudinal bulk vibration along a thickness direction of a piezoelectric layer of the FBAR, a resonator operating at higher frequency bands can be manufactured with ease, by thinning the film thickness of the piezoelectric layer. And since the fabrication accuracy of the piezoelectric layer along a planar direction is enough around one micrometer level, an increase in the manufacturing cost ascribable to the move to higher frequency operations is not caused. Also, it is not necessary for the FBAR to be fabricated on a piezoelectric substrate such as the SAW filter, the FBAR is comparatively easy to fabricate on a silicon (Si) substrate and a gallium arsenide (GaAs) substrate, and the filter implemented by the plurality of FBARs can be monolithically integrated in a single LSI chip. Because, in the FBAR, the resonance frequency is determined by acoustic wave velocity and film thickness of the piezoelectric layer, the resonance frequency is two GHz at a film thickness of one to two micrometers and is five GHz at a film thickness of 0.4 to 0.8 micrometer. Therefore, the FBAR facilitates higher frequency operations up to several decades GHz.

In earlier technology, materials having low elastic losses (internal friction) such as molybdenum (Mo), tungsten (W), iridium Ir), are regarded to be advantageous as materials of the FBAR (see U.S. Pat. No. 5,587 620).

According to the manufacturing method of the FBAR disclosed in Japanese Published Unexamined Patent Application No. 2000-69594, the sacrificial layer is formed at the top surface of the Si substrate, and the bottom electrode is formed on the sacrificial layer, and further, on the top surface of the bottom electrode, a piezoelectric thin film is stacked. Then, the piezoelectric thin film is delineated so as to form a pattern of a piezoelectric layer, occupying a limited area, and the top electrode is delineated on the piezoelectric thin film. In the sequence of formation processes, after the piezoelectric thin film is delineated so as to form the pattern of the piezoelectric layer, a pattern of an extraction wiring of the bottom electrode is required to be delineated by wet etching using such solutions as potassium hydroxide (KOH), tetra methyl ammonium hydroxide (TMAH), for instance, or dry etching such as reactive ion etching (RIE) method. Aluminum nitride (AlN), or alternatively zinc oxide (ZnO) is generally adopted for material of the piezoelectric thin film and especially AlN is widely used because of the material behavior that facilitates the matching with the semiconductor manufacturing processes. However, there are problems that in either case of using AlN or ZnO, the etching rate of the piezoelectric thin film is low and sufficient etch selectivity of the piezoelectric thin film to the bottom electrode is hard to be achieved, when the piezoelectric thin film is selectively etched to make the bottom electrode bare so that the extraction wiring can be connected to the bottom electrode. When the etch selectivity of the piezoelectric thin film to the bottom electrode is not sufficient, an over-etching for assuring uniformity of the etching depth decreases the film thickness of the bottom electrode in part of an element region or over the whole element region. Then, series resistance in the bottom electrode increases and contact resistance between the extraction wiring and the bottom electrode increases due to a surface roughness and degeneration of the bottom electrode.

As parameters representing the resonance characteristic of the FBAR, electromechanical coupling factor $k_t^2$, which is an indicator of the effectiveness with which a piezoelectric material converts electrical energy into mechanical energy, or converts mechanical energy into electrical energy and Q-value, which is a measure of the sharpness of the resonance peak in the frequency response of the system, are employed. In addition, with regard to the Q-value, there are two Q-values; one is a Q-value at a resonance frequency in which electrical impedance becomes a minimum and another is a Q-value at an anti-resonance frequency in which the electrical impedance becoming a maximum. When a filter is implemented by a combination of resonators, a frequency bandwidth of the filter is proportional to the electromechanical coupling factor $k_t^2$, and insertion losses in the frequency band are inversely proportional to a quality factor defined by the product of the Q-value and the electromechanical coupling factor $k_t^2$. Since the electromechanical coupling factor $k_t^2$ is a value proper to material, there is no necessity for increasing the electromechanical coupling factor $k_t^2$, if an appropriate frequency bandwidth can be realized by improving the crystal purity and controlling the crystal orientation to a polarization direction. Therefore, the Q-value must be set as high as possible so as to decrease the insertion losses. Especially, for fabricating the FBAR, not only a material for the piezoelectric thin film but materials for top and bottom electrodes of the FBAR must be considered in the selection of materials. In a piezoelectric resonator implemented by a ceramic material having a film thickness of above 100 micrometers, mass and resistance in the top and bottom electrodes do not affect the resonance characteristic of the piezoelectric resonator, while in a FBAR having a film thickness with only several micrometers, the film thickness of the top and bottom electrodes becomes relatively larger compared with the film thickness of the piezoelectric layer, the resonance characteristic of the FBAR is greatly affected by material properties of the top and bottom electrodes.

Molybdenum (Mo), tungsten (W), iridium (Ir), are regarded to be advantageous as electrode materials of the FBAR, as mentioned in U.S. Pat. No. 5,587,620. However, melting points of such refractory metals are extremely high and have the following problems when a metallic thin film is formed by such refractory metals;

(a) The metallic thin film formed of the refractory metals, is susceptible to residual stress.

(b) A rate of increase in resistivity for the metallic thin film is larger than the increase in resistivity for a bulk metallic material, because the grain size in the metallic thin film is smaller than the grain size in the bulk metallic material.

SUMMARY OF THE INVENTION

In view of these situations, it is an object of the present invention to provide a FBAR, in which the rate of increase in resistivity of a top electrode of the FBAR, the increase in resistivity is peculiar to the property of refractory metal, is sufficiently suppressed and the increase of the residual stress in the top electrode is sufficiently relaxed so as to establish a small series resistance in the top electrode, thus achieving a large electromechanical coupling factor $k_t^2$, a filter implemented by a plurality of such FBARs, and a method for manufacturing the FBAR, when refractory metal is employed as the top electrode in the FBAR.

An aspect of the present invention may inhere in a film bulk acoustic-wave resonator encompassing: (a) a substrate having a cavity; (b) a bottom electrode partially fixed to the substrate, part of the bottom electrode is mechanically suspended above the cavity; (c) a piezoelectric layer provided on the bottom electrode; and (d) a top electrode provided on the piezoelectric layer having crystal axes oriented along a thickness direction of the piezoelectric layer, a full width at half maximum of the distribution of the orientations of the crystal axes is smaller than or equal to about six degrees.

Another aspect of the present invention may inhere in a filter formed on a substrate having first, second and third cavities, connected between first and second ports, the first port being specified by first and second nodes and the second port being specified by third and fourth nodes, the filter encompassing: (a) a first film bulk acoustic-wave resonator encompassing a first bottom electrode connected to the first node, partially fixed to the substrate, part of the first bottom electrode is mechanically suspended above the first cavity, a first piezoelectric layer provided on the first bottom electrode; and a first top electrode provided on the first piezoelectric layer; (b) a second film bulk acoustic-wave resonator encompassing: a second bottom electrode connected to the second and fourth nodes, partially fixed to the substrate, part of the second bottom electrode is mechanically suspended above the second cavity; a second piezoelectric layer provided on the second bottom electrode; and a second top electrode connected to the first top electrode so as to form a common top electrode, provided on the second piezoelectric layer, and (c) a third film bulk acoustic-wave resonator encompassing: a third bottom electrode connected to the common top electrode, partially fixed to the substrate, part of the third bottom electrode is mechanically suspended above the third cavity; a third piezoelectric layer provided on the third bottom electrode; and a third top electrode connected to the third node, provided on the third piezoelectric layer. Here, the first, second and third top electrodes have crystal axes oriented along thickness directions of the first, second and third piezoelectric layer respectively, a full width at half maximum of the distribution of the orientations of the crystal axes is smaller than or equal to about six degrees.

Still another aspect of the present invention may inhere in a method for manufacturing a film bulk acoustic-wave resonator, including: (a) forming a bottom electrode on a substrate; (b) depositing a piezoelectric thin film on the bottom electrode, and depositing successively a metallic film on the piezoelectric thin film; and (c) delineating the metallic film so as to form a pattern of a top electrode, and delineating successively the piezoelectric thin film so as to form a pattern of the piezoelectric layer.

A further aspect of the present invention may inhere in a method for manufacturing a film bulk acoustic-wave resonator, including: (a) forming a bottom electrode on a substrate; (b) depositing successively a piezoelectric thin film, an amorphous thin film and a metallic film on the bottom electrode; and (c) delineating the metallic film and the amorphous thin film so as to form a pattern of double-layer implemented by a top electrode and an amorphous underlying layer under the top electrode, and delineating successively the piezoelectric thin film so as to form a pattern of the piezoelectric layer.

BRIEF DESCRIPTION OF THE DRAWINGS

FIG. 13A is a schematic plan view of a FBAR according to a modification of the third embodiment of the present invention;

FIG. 13B is a schematic cross sectional view of the FBAR according to the modification of the third embodiment, taken on line XIVB-XIVB in FIG. 13A;

DETAILED DESCRIPTION OF THE INVENTION

Figure 1A:
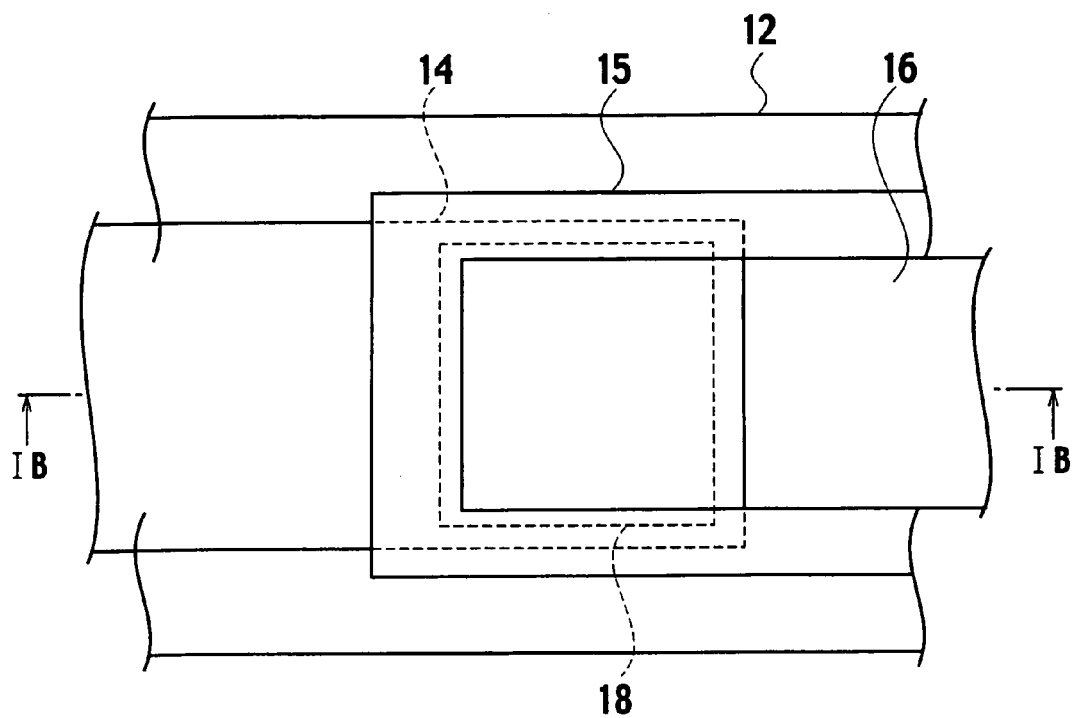
FIG. 1A is a schematic plan view of a film bulk acoustic-wave resonator (FBAR) according to a first embodiment of the present invention.

In the following description specific details are set forth, such as specific materials, processes and equipment in order to provide a thorough understanding of the present invention.

It will be apparent, however, to one skilled in the art that the present invention may be practiced without these specific details. In other instances, well-known manufacturing materials, processes and equipment are not set forth in detail in order not to unnecessarily obscure the present invention. Applicants will first summarize the preliminary consideration of the invention before embarking on a detailed description of each embodiment with reference to the drawings.

Elastic losses in the piezoelectric layer, elastic losses in the top and bottom electrodes, and series resistance in the top and bottom electrodes affect the Q-value at resonance frequency, while elastic losses in the piezoelectric layer, elastic losses in the top and bottom electrodes, conductance of the substrate, and dielectric losses in the piezoelectric layer affect the Q-value at anti-resonance frequency. According to analysis of experimental data by inventors of the present invention, as the origin of degradation of the Q-value at resonance frequency, series resistance in the top and bottom electrodes plays a dominant role, and elastic losses in the piezoelectric layer plays a second dominant origin, while elastic losses in the top and bottom electrodes does not have much affect. As the origin of degradation of the Q-value at anti-resonance frequency, elastic losses in the piezoelectric layer is dominant, while conductance of the substrate and dielectric losses in the piezoelectric layer do not have much affect. Therefore, in selecting materials for the top and bottom electrodes, resistivity of the materials is the most important parameter.

Generally, when a thin film is formed of a metallic material, resistivity of the metallic thin film is higher than resistivity of the bulk metallic material. This is because a scattering of carriers at surfaces of the metallic thin film, a scattering of carriers by a grain boundary and a scattering of carriers by crystal defects of the metallic thin film generate resistivity of the metallic thin film. In a FBAR, each of the top and bottom electrodes is implemented by a metallic thin film having a several hundred nanometers thickness, the scattering of carriers at surfaces of the metallic thin film does not affect the increase in resistivity of the metallic thin film and dominant origin of the increase in resistivity is considered to be the scattering of carriers by the crystal grain boundary. If such metallic thin films are grown at the same temperature, the higher the melting point of material, the smaller the grain size of the metallic thin film. Therefore, the rate of increase in resistivity of metallic thin film is larger, compared with that of bulk metallic material. For instance, although molybdenum (Mo) has almost the same resistivity as cobalt (Co) in bulk, the resistivity of Co in a thin film increases one and half times as high as the resistivity of Co in bulk, and the resistivity of Mo in thin film increases twice as high as the resistivity of Mo in bulk (See "OYO BUITURI (a Japanese-language membership journal of The Japan Society of Applied Physics)", Vol. 147, No. 3, p. 192, (1978); and "Solar Energy Materials and Solar Cells", Vol. 51, p. 327, (1998)). Also, according to experimental investigations by inventors of the present invention, it turned out that residual stress in metallic thin film formed of refractory metals such as Mo and Ir, tends to become large when the resistivity of the metallic thin film is decreased by choosing an optimum condition for formation of the metallic thin film so as to narrow the manufacturing margin of the metallic thin film.

Taking the above-problems into consideration, experimental investigations are repeated by inventors of the present invention, as to what kind of metal can be adopted so as to suppress the increase in resistivity. In earlier technology, with regard to a bottom electrode formed under the piezoelectric layer, various investigations are made, through orientating the piezoelectric thin film, so as to obtain preferable piezoelectric characteristics. On the contrary, little investigations have been made with regard to a top electrode formed on the piezoelectric layer. Therefore, for the first time, inventors of the present invention made various experimental and theoretical considerations upon the top electrode of the FBAR, and contrived and developed new FBARs as disclosed in the following first to forth embodiments.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally and as it is conventional in the representation of acoustic devices, it will be appreciated that the various drawings are not drawn to scale from one figure to another nor inside a given figure, and in particular that the layer thicknesses are arbitrarily drawn for facilitating the reading of the drawings.

Figure 1B:
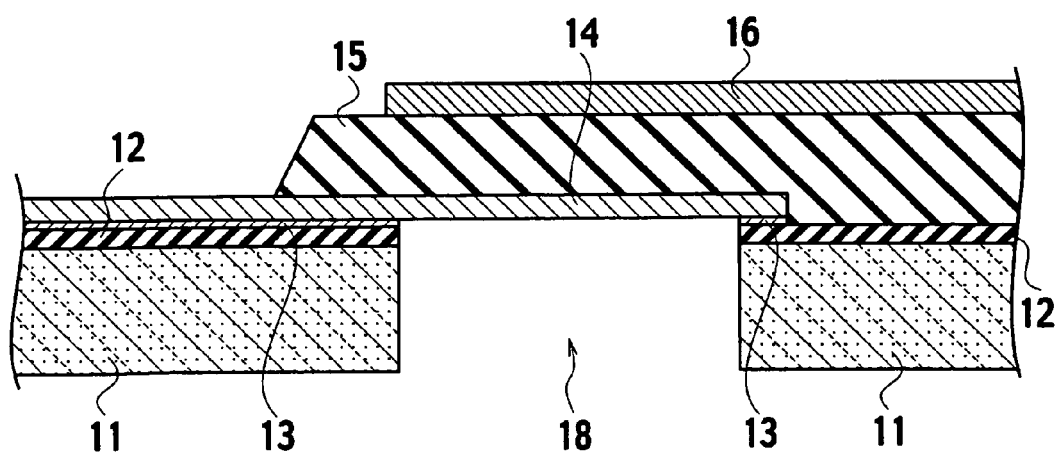
FIG. 1B is a schematic cross sectional view of the FBAR according to a first embodiment, taken on line IB-IB in FIG. 1A.

Prepositions, such as "on", "over", "under", "beneath", and "normal" are defined with respect to a planar surface of the substrate, regardless of the orientation in which the substrate is actually held. A layer is on another layer even if there are intervening layers First Embodiment As shown in FIGS. 1A and 1B, a film bulk acoustic-wave resonator (FBAR) according to a first embodiment of the present invention includes a substrate 11, an insulating film 12 provided on the substrate 11, a bottom electrode 14 provided on the insulating film 12, a piezoelectric layer 15 provided on the bottom electrode 14, and a top electrode 16 provided on the piezoelectric layer 15. Part of the bottom electrode 14 is mechanically suspended above a cavity 18 formed in the substrate 11 and in the insulating film 12. The top electrode 16 has aligned crystal axes oriented along a thickness direction of the piezoelectric layer 15. Full width at half maximum (FVV of the distribution of the orientations in the top electrode 16 along the peak crystal axis, is smaller than or equal to about six degrees, so that the top electrode 16 can utilize a bulk vibration along the thickness direction of the piezoelectric layer 15. The FWHM in the distribution of the orientations may be measured in a rocking curve of X-ray diffraction. If the FWHM is larger than six degrees and crystallographic quality of the top electrode 16 deteriorates, desired value of electromechanical coupling factor $k_t^2$ and Q-value are difficult to be ensured in the FBAR according to the first embodiment. The FWHM of distribution of the orientations in the top electrode 16 along the peak crystal axis may be preferably smaller than or equal to about four degrees, and more preferably smaller than or equal to about three degrees. The smaller the FWHM is, the higher the crystallographic quality of the top electrode 16, and a higher electromechanical coupling factor $k_t^2$ and a higher Q-value can be achieved.

The cavity (open cavity) 18 is formed along a direction from the bottom surface of the substrate 11 to the top surface of the substrate 11 for making a bottom surface bare of the bottom electrode 14. As shown in the plan view of FIG. 1A, in the FABR of the first embodiment, a cavity area occupied by the cavity 18, is defined in the inside of a bottom electrode area occupied by the bottom electrode 14. However, the cavity area may extend to the outside of the bottom electrode area. And the FBAR of the first embodiment further includes a lower amorphous underlying layer 13 inserted between the top surface of the insulating film 12 and the bottom surface of the bottom electrode 14, at a different site from the area in which the bottom surface of the bottom electrode 14 is laid bare by the cavity 18.

In the remaining area not occupied by the pattern of a double layer implemented by the bottom electrode 14 and the lower amorphous underlying layer 13 in the plan view shown in FIG. 1A, the piezoelectric thin film 15 is directly provided on the insulating film 12 in the remaining area. For main constituent of the lower amorphous underlying layer 13, materials such as an aluminum-tantalum (Ta—Al) alloy film and a titanium-boride (TiB$_2$) film having about five to 100 nm film thickness, or preferably about 15 to 30 nm film thickness, can be adopted.

In the FBAR shown in FIG. 1, resonance frequency can be determined by adjusting the film thicknesses of the piezoelectric layer 15 and the bottom electrode 14 and the top electrode 16, since the FBAR utilizes a bulk vibration along the thickness direction of the piezoelectric layer 15. By the lower amorphous underlying layer 13, the orientation of the piezoelectric layer 15 is easy to be oriented uniformly along a propagation direction of a surface acoustic wave (SAW) using a longitudinal vibration mode. For instance, when piezoelectric thin films such as aluminum nitride (AlN), cadmium sulfide (CdS), or alternatively zinc oxide (ZnO) having a wurtzite lattice structure are employed to implement the piezoelectric layer 15, orientations of the crystal axes in the piezoelectric layer 15 are easy to be controlled uniformly along the c-axis of a hexagonal lattice structure, or along <0001> direction by using crystals having wurtzite lattice structure such as AlN, CdS and ZnO. By controlling a polarization direction (orientation) of the piezoelectric layer 15 to the c-axis, a higher electromechanical coupling factor $k_t^2$ and a higher Q-value are easy to be achieved in the piezoelectric layer 15.

The top electrode 16 may be mainly formed of metallic materials having about 600 to 2300 degrees C. melting point. Especially, when the main constituent of the top electrode 16 is formed of metallic materials having melting points in the range from about 600 to 2300 degrees C. and bulk resistivity smaller than and equal to about 15 micro-ohm-centimeters, the increase in resistivity due to the crystal defects is negligible, because the melting points of the metallic materials are high enough so as to ensure a high crystallographic quality. The "bulk resistivity" is measured in bulk material. And, surface morphology becomes excellent in the process of thin film formation due to the high melting point. More specifically, it is preferable that the electrode material for the top electrode 16 is selected from the group consisting of aluminum (Al) having a melting point of 660 degrees C., chromium (Cr) having a melting point of 1875 degrees C., iron (Fe) having a melting point of 1536 degrees C., cobalt (Co) having a melting point of 1492 degrees C., nickel (Ni) having a melting point of 1453 degrees C., ruthenium (Ru) having a melting point of 2280 degrees C., rhodium (Rh) having a melting point of 1960 degrees C., palladium (Pd) having a melting point of 1552 degrees C., platinum (Pt) having a melting point of 1770 degrees C. and copper (Cu) having a melting point of 1083 degrees C. However, the elastic constant and the acoustic impedance of the above-mentioned metallic material group are low, compared with the refractory metals such as molybdenum (Mo) having a melting point of 2617 degrees C., tungsten (W) having a melting point of 3380 degrees C. and iridium (Ir) having a melting point of 2443 degrees C. Therefore, since the strain of the bulk vibration in the piezoelectric layer 15 transudes from a boundary between the top electrode 16 and the piezoelectric layer 15, which reduces vibration energy confined in the piezoelectric layer 15, the effective electromechanical coupling factor $k_t^2$ of the FBAR decreases a little. According to the FBAR of the first embodiment, because the orientations of the crystal axes in the top electrode 16 are aligned along a specific direction such that the FWHM in the distribution of the orientations in the top electrode 16 along the peak crystal axis is smaller than or equal to about six degrees, and along the specific direction, the elastic constant of the top electrode 16 become maximum, suppressing the decrease in the electromechanical coupling factor $k_t^2$ of the top electrode 16. For instance, the elastic constant of Ni oriented along <111> direction is over twice as high as Ni oriented to <100> direction. Therefore, it is preferable that the top electrode 16 is mainly formed of such metallic materials as Co and Ru having <0001> orientation, or alternatively, Al, Cr, Fe, Ni, Cu, Pt, Rh and Pd having <111> orientation.

Compared with metallic materials lying out of the melting point range from about 600 to 2300 degrees C., if metallic thin films for the top electrode 16, formed of metallic materials lying in the melting point range from about 600 to 2300 degrees C., are grown at the same growth temperature, the lower the melting point of material, the larger the grain size of the metallic thin film. Therefore, a high crystallographic quality of the top electrode 16 can be achieved and a resistivity of the metallic thin film becomes approximately equivalent to the resistivity of bulk, by adopting the metallic materials having a melting point of about 600 to 2300 degrees C. In other words, although the resistivity of the metallic thin film is affected by the scattering of carriers at surfaces of the metallic thin film, the scattering of carriers by the grain boundary and the scattering of carriers by crystal defects of the metallic thin film, by selecting the metallic materials with a melting point of about 600 to 2300 degrees C. for the materials of the top electrode 16, the grain size of the top electrode 16 becomes large and the scattering of carriers by the grain boundary is decreased. Also, since a high crystallographic quality of the top electrode 16 is achieved, the scattering of carriers by crystal defects of the metallic thin film can be decreased. By the result, since the resistivity and the series resistance in the top electrode 16 of the FBAR is decreased, the electromechanical coupling factor $k_t^2$ and the Q-value increase.

Note that other metallic materials such as magnesium (Mg) having a melting point of 649 degrees C., lantern (La) having a melting point of 920 degrees C., silver (Ag) having a melting point of 961 degrees C., gold (Au) having a melting point of 1063 degrees C., beryllium (Be) having a melting point of 1287 degrees C. and thorium (Th) having a melting point of 1755 degrees C., satisfy the criterion of the melting points ranging from about 600 to 2300 degrees C. and the bulk resistivity being smaller than and equal to about 15 micro-ohm-centimeters. The above-listed metallic materials may be theoretically adopted for the materials of the top electrode 16 of the FBAR of the first embodiment, however, in the above-listed metallic materials, some materials are included in which chemical stability, radioactivity, commercial availability etc. must be considered.

In this manner, in the FBAR according to the first embodiment, by selecting the metallic materials having a melting point of about 600 to 2300 degrees C. for the top electrode 16, and by orientating the top electrode 16 in a direction where the elastic constant of the top electrode 16 increases most, acoustic impedance increases, which can prevent the bulk vibration of the piezoelectric layer from propagating to the top electrode 16. Further, since the series resistance in the top electrode 16 is decreased, the FBAR having a high Q-value and a high effective electromechanical coupling factor $k_t^2$ can be achieved. And note that the above-explanations were made with regard to the top electrode 16, the same explanations will be applied to the bottom electrode 14 in theory.

For instance, the FBAR of the first embodiment, encompassing a Si substrate as the substrate 11, an oxide film as the insulating film 12, a lower amorphous underlying layer 13 formed of a Ta—Al alloy film with about 20 nm film thickness, a bottom electrode 14 formed of an Al film with about 300 nm film thickness, a piezoelectric layer 15 formed of an AlN film with about 2.2 micrometers film thickness, a top electrode 16 formed of an Al film with about 300 nm film thickness shows excellent resonance characteristics such that at a resonance frequency of about 1.9 GHz, the electromechanical coupling factor $k_t^2$ is 6.4%, the Q-value at the resonance frequency is 850, and the Q-value at the anti-resonance frequency is 750, according to an evaluation by a measurement using a vector network analyzer (HP8510C). Also spurious vibration was hardly observed either. And the series resistance in the electrodes of the FBAR is found to be below 0.5 ohm by a parameter fitting in the frequency dependence of the impedance, in a wide measurement range of impedance from 0.1 to 10 GHz. Further, rupture and cracking of the hollow structure in the FBAR of the first embodiment due to residual stress could not be observed either.

As a comparative example of the FBAR of the first embodiment, a FBAR, encompassing the same structure as the FBAR of the first embodiment, but the bottom electrode 14 and the top electrode 16 are formed of Ir films, shows resonance characteristics such that the electromechanical coupling factor $k_t^2$ is 6.7%, the Q-value at the resonance frequency is 370, and the Q-value at the anti-resonance frequency is 800, according to the evaluation by the measurement using the vector network analyzer. However, the rupture and cracking of the hollow structure in the FBAR of the comparative example due to the residual stress was observed a lot, and the manufacturing yield could not reach to 20%. And the data of series resistances of the electrodes of the FBAR of the comparative example are dispersed between one to three ohms by a parameter fitting of the frequency dependence of the impedance, in a wide measurement range of the impedance. It is confirmed, by a scanning electron microscope (SEM) observation, that the origin of dispersion of data of the series resistance is due to the crack generated in the FBAR structure of the comparative example.

As will be explained hereinafter, the FBAR according to the first embodiment can be manufactured through a sequence of manufacturing processes in which a piezoelectric thin film is deposited on the bottom electrode 14, and a mother material metallic film for the top electrode 16 is successively deposited on the piezoelectric thin film, and after a pattern of the top electrode 16 is delineated, a pattern of the piezoelectric layer 15 is delineated, so that the FWHM of distribution of the orientations in the top electrode 16 along the peak crystal axis is set smaller than or equal to about six degrees.

With reference to FIGS. 2A-2E, a sequence of manufacturing processes of the FBAR according to the first embodiment is explained. Note that the FBAR of the first embodiment can be manufactured by various manufacturing methods such as a modification of the first embodiment, other than the sequence of manufacturing processes disclosed by the following example.

Figure 2A:
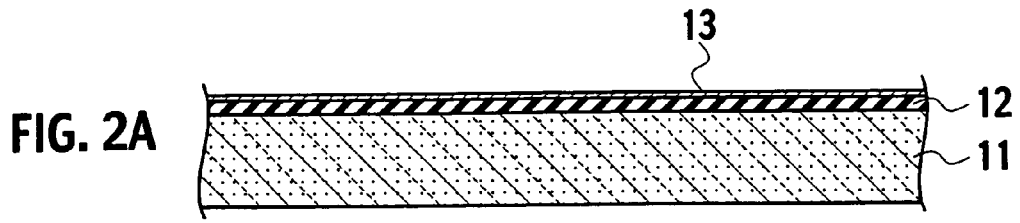
FIG. 2A is a process flow cross sectional view showing an intermediate product of the FBAR, corresponding to the cross sectional view taken on line IB-IB in FIG. 1A, explaining a manufacturing method of the FBAR according to the first embodiment.

(a) First, a substrate 11 such as Si (100) substrate is prepared. And on the substrate 11, an insulating film 12 is formed by thermal oxidation methods, etc. Further, on the insulating film 12, an amorphous thin film (a mother material film for the lower amorphous underlying layer) 13 having a five to 100 nm film thickness, or preferably a ten to 30 nm film thickness, is deposited using radio frequency (RF) magnetron sputtering, etc, as shown in FIG. 2A. For instance, a Ta—Al alloy film for the lower amorphous underlying layer 13, can be deposited using Ta and Al targets and argon gas, at a substrate temperature of room temperature by RF magnetron sputtering, etc.

Figure 2B:
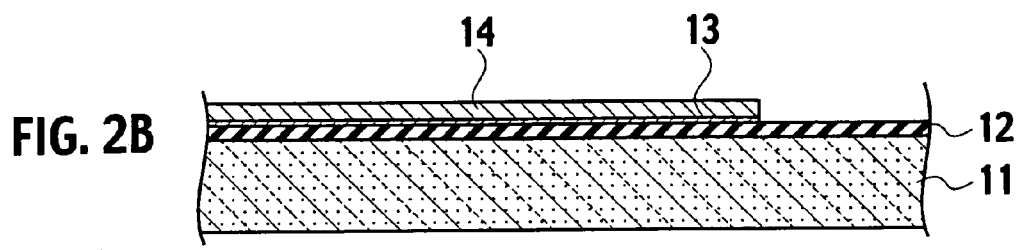
FIG. 2B is a subsequent process flow cross sectional view showing the intermediate product of the FBAR according to the first embodiment after the process stage shown in FIG. 2A.

(b) Next, on the amorphous thin film 13, a metallic film (a mother material metallic film) such as an Al film having about 150 to 600 nm film thickness, or preferably a 250 to 350 nm film thickness, is deposited using RF magnetron sputtering, etc. The amorphous thin film 13 and the Al film (a mother material metallic film for the bottom electrode) 14 can be deposited successively in the same deposition-chamber. And the Al film 14 is delineated by photolithography and an accompanying reactive ion etching (RIE) method so as to form a pattern of the bottom electrode 14 as shown in FIG. 2B. In the case where using an Al film for the bottom electrode 14, the pattern of the bottom electrode 14 can be delineated by RIE method using chloride based etching gas, and in the case where using a Ta—Al alloy film for the lower amorphous underlying layer 13, the Ta—Al alloy film can be selectively etched by RIE method with fluorine based etching gas, such as octafluorocydobutane ($C_4F_8$) so as to form a pattern of a double-layer implemented by the bottom electrode 14 and the lower amorphous underlying layer 13 under the bottom electrode 14.

Figure 2C:
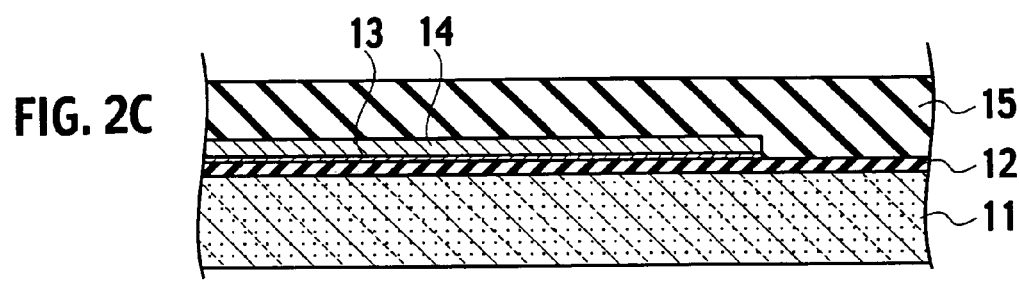
FIG. 2C is a subsequent process flow cross sectional view showing the intermediate product of the FBAR according to the first embodiment, after the process stage shown in FIG. 2B.

(c) Afterwards, on the bottom electrode 14, a piezoelectric thin film 15, or a mother material film for the piezoelectric layer, having a wurtzite lattice structure with about 0.5 to 3 micrometers thickness is deposited by RF magnetron sputtering method, etc. as shown in FIG. 2C. Because the remaining area not occupied by the pattern of the bottom electrode 14, the insulating film 12 is laid bare in the plan view (See FIG. 1A), the piezoelectric thin film 15 is directly deposited on the insulating film 12 in the remaining area. The thickness of the piezoelectric thin film 15 varies by resonance frequencies, and the thickness of the mother material film for the piezoelectric layer may be determined at about 2.2 micrometers, if the piezoelectric thin film 15 is AlN and if the resonance frequency is supposed to be about 1.9 GHz.

Figure 2D:
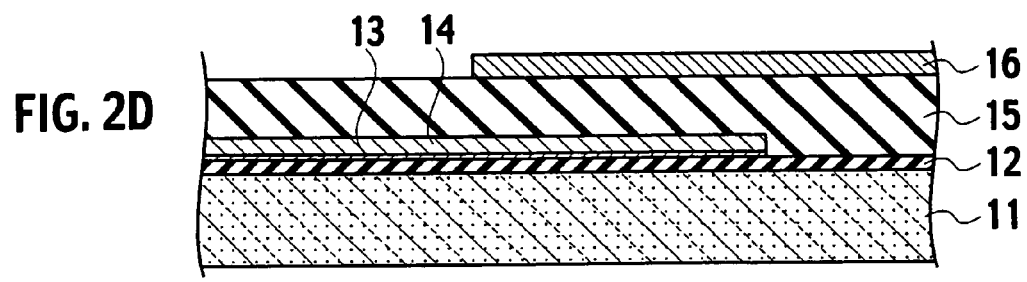
FIG. 2D is a further subsequent process flow cross sectional view showing the intermediate product of the FBAR according to the first embodiment after the process stage shown in FIG. 2C.

(d) Subsequently, a metallic film (a mother material metallic film for the top electrode) 16 having about 150 to 600 nm film thickness, or preferably a 250 to 350 nm film thickness, is deposited so that the second metallic film 16 can cover an entire surface of the piezoelectric thin film 15. For instance, when an AlN film with about 2.2 micrometers film thickness is employed for the piezoelectric thin film 15, and an Al film with about 300 nm film thickness for the second metallic film 16, the AlN film and the Al film can be deposited successively in the deposition chamber (vacuum chamber) of the same fabrication tool (sputtering tool) without exposure to the air, by a reactive RF magnetron sputtering method. Subsequently the Al film is delineated by photolithography and an accompanying wet etching using a non-oxidizing acid solution such as hydrochloric acid (HCl) solution as shown in FIG. 2D.

Figure 2E:
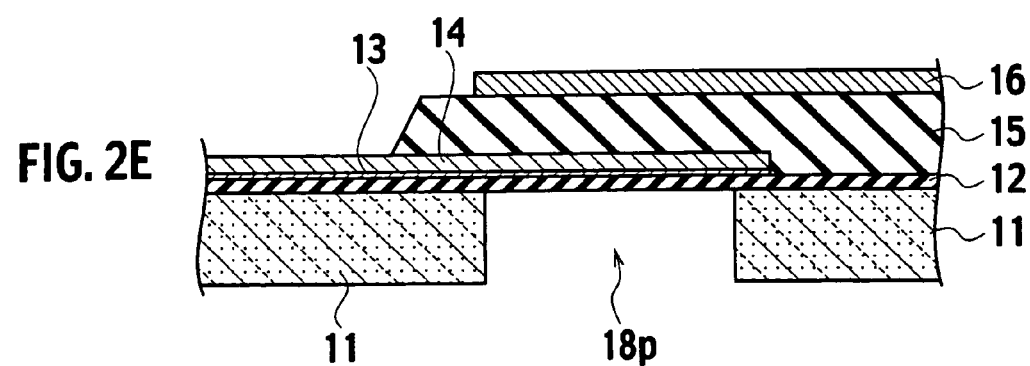
FIG. 2E is a still further subsequent process flow cross sectional view showing the intermediate product of the FBAR according to the first embodiment after the process stage shown in FIG. 2D.

(e) Next, a pattern of the piezoelectric layer 15 is delineated by photolithography and an accompanying RIE method with chloride based etching gas. Afterwards, the thickness of the substrate 11 is adjusted to such a film thickness ranging from about 60 to 300 nm, preferably about 80 to 250 nm, for instance the thickness of the substrate 11 is adjusted to about 100 nm by polishing, and an etching-mask is delineated on the bottom surface of the substrate 11 by photolithography. In the case where using a Si substrate for the substrate 11, the Si substrate 11 is selectively etched from the bottom surface by RIE method with fluoride based etching gas, so as to establish the cavity (through-hole) 18p having vertical sidewalls in a cross-sectional view as shown in FIG. 2E.

(f) Afterwards, the insulting film 12 and the lower amorphous underlying layer 13, which remain at the bottom of the cavity (through-hole) 18p, are removed using wet etching and dry etching such as RIE method with fluoride based etching gas, thereby completing the sequence of formation processes of the FBAR of the first embodiment shown in FIG. 1B.

According to the manufacturing method of the FBAR of the first embodiment, since the piezoelectric thin film 15 and mother material metallic film for the top electrode 16 can be deposited successively in the same deposition chamber (vacuum chamber) of the same fabrication tool (sputtering tool) without exposure to the air, excellent morphology at a boundary between the piezoelectric layer 15 and the top electrode 16 can be achieved. By the formation process, high crystallographic quality of the top electrode 16 is achieved which easily enables the FWHM of distribution of the orientations in the top electrode 16 along the peak crystal axis to be smaller than or equal to about six degrees. Therefore, according to the manufacturing method of the FBAR of the first embodiment, the FBAR having large technical advantages such that the series resistance in the electrodes is low, thin films of the electrodes are not subject to residual stress and the electromechanical coupling factor $k_t^2$ is high, can be achieved with ease.

[Micro Mechanical Filter]

Figure 3:
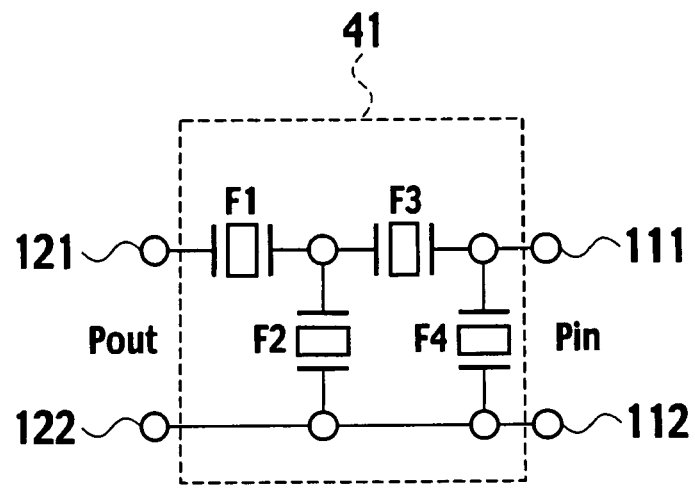
FIG. 3 is a schematic circuit diagram illustrating an example of a micro mechanical filter implemented by a plurality of FBARs of the first embodiment of the present invention.

FIG. 3 shows an example of a filter (a micro mechanical filter) implemented by a plurality of FBARs of the first embodiment. A ladder-type filter 41 shown in FIG. 3 is implemented by four FBARs $F_1$, $F_2$, $F_3$ and $F_4$, which are connected in series and in parallel to each other. With regard to a configuration of the ladder-type filter 41 shown in FIG. 3, when the ladder-type filter 41 is actually manufactured, various topologies can be considered. For instance, the ladder-type filter 41 can be monolithically integrated in an identical substrate. An input port (second port) $P_{in}$ shown in FIG. 3 has a first input terminal (third node) 111 and a second input terminal (fourth node) 112. The first input terminal (third node) 111 of the input port (second port) $P_{in}$ is connected to the top electrode 16 of the fourth FBAR $F_4$ and the second input terminal (fourth node) 112 of the input port (second port) $P_{in}$ is connected to the bottom electrode 14 of the fourth FBAR $F_4$. By the configuration, because the top electrode 16 of the fourth FBAR $F_4$ is connected to the top electrode 16 of the third FBAR $F_3$, the top electrode 16 of the fourth FBAR $F_4$ and the top electrode 16 of the third FBAR $F_3$ can be merged into a single common top electrode.

The bottom electrode 14 of the third FBAR $F_3$ is connected to the top electrode 16 of the first FBAR $F_1$ and the top electrode 16 of the second FBAR $F_2$ respectively. Because the top electrode 16 of the first FBAR $F_1$ is connected to the top electrode 16 of the second FBAR $F_2$, the top electrode 16 of the first FBAR $F_1$ and the top electrode 16 of the second FBAR $F_2$ can be merged into a single common top electrode.

And an output port (first port) $P_{out}$ shown in FIG. 3 has a first output terminal (first node) 121 and a second output terminal (second node) 122. The bottom electrode 14 of the first FBAR $F_1$ is connected to the first output terminal (first node) 121 of the output port (first port) $P_{out}$ and the bottom electrode 14 of the second FBAR $F_2$ is connected to the second output terminal (second node) 122 of the output port (first port) $P_{out}$.

[Semiconductor Integrated Circuit]

Figure 4:
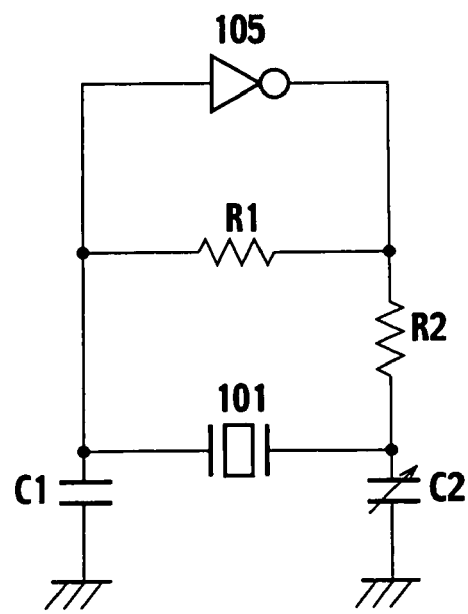
FIG. 4 is a schematic circuit diagram illustrating an example of a voltage-controlled oscillator (VCO) implemented by the FBAR of the first embodiment of the present invention.

Also the FBAR of the first embodiment can be employed in a semiconductor integrated circuit such as a voltage-controlled oscillator (VCO) of mobile communication devices by a combination of a variable capacitance C2 and an amplifier 105 as shown in FIG. 4. For the amplifier 105, a complementary metal oxide semiconductor (CMOS) inverter can be used. Namely, in FIG. 4, the top electrode 16 of a FBAR 101 is connected to the variable capacitance C2, and the bottom electrode 14 of the FBAR 101 is connected to a fixed capacitance C1, and further the top electrode 16 of the FBAR 101 is connected to one terminal of a resistance R2. Between the other terminal of the resistance R2 and the bottom electrode 14 of the FBAR.101, a parallel circuit implemented by the amplifier 105 and a feedback resistance R1 is connected The parallel circuit is Colpitts oscillator in which signal from an output terminal of the amplifier 105 is positively feed-backed to an input terminal of the amplifier 105, by the feedback resistance R1, so that the signal can oscillate at the resonant frequency of the FBAR 101. The variable capacitance C2 can be formed of a variable capacitance diode ("vari-cap") so as to adjust the oscillating frequency. The variable capacitance C2, the fixed capacitance C1, the FBAR 101, the resistance R2, the feedback resistance R1 and the amplifier 105 may be integrated monolithically in an identical substrate, or alternatively can be integrated in a hybrid configuration.

[Transceiver]

Figure 5:
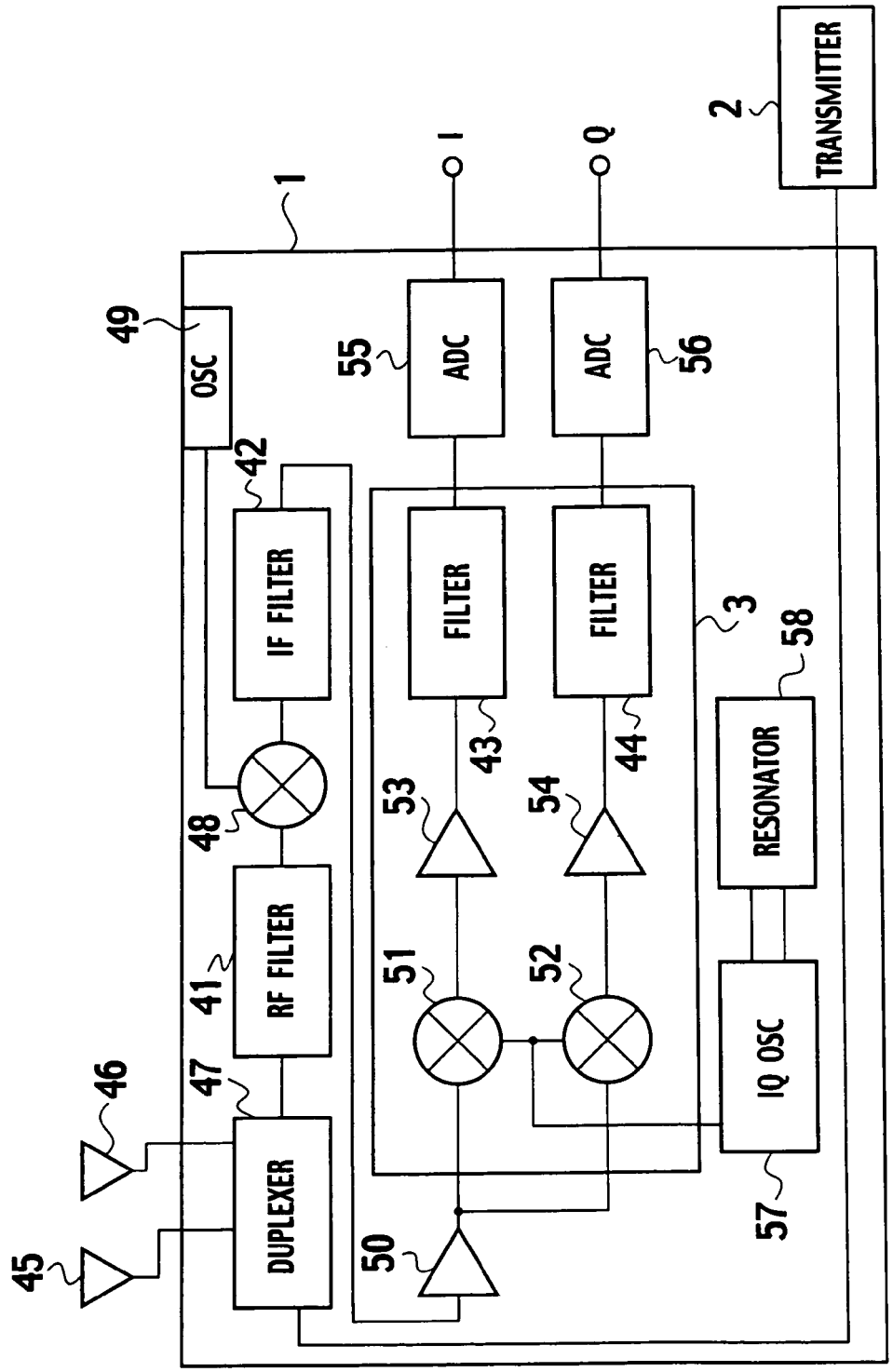
FIG. 5 is a schematic circuit diagram illustrating an example of a receiver circuit of a portable transceiver implemented by a plurality of FBARs of the first embodiment of the present invention.

FIG. 5 shows a receiver circuit of a portable transceiver, which encompasses a plurality of micro mechanical filters shown in FIG. 3 so as to implement a radio-frequency (RF) filter 41 and an intermediate frequency (IF) filter 42. The receiver circuit of the portable transceiver shown in FIG. 5 includes the RF filter 41 implemented by the micro mechanical filters of FIG. 3, a mixer 48 connected with the RF filter 41 and a local oscillator 49 connected with the mixer 48, as an radio-frequency (RF) front-end unit. The mixer 48 mixes RF signal delivered from the RF filter 41, with RF signal delivered from the local oscillator 49, so as to generate, for example, the intermediate-frequency (IF) signal ranging from 200 MHz to 500 MHz. The RF filter 41 is connected to a first antenna 45 and a second antenna 46 through a duplexer (an antenna switch) 47. Although in FIG. 5, two antennas of the first antenna 45 and the second antenna 46 are connected, the number of antenna is not limited to two.

The RF signal received at the first antenna 45 and the second antenna 46 and the RF signal delivered from the local oscillator 49, are mixed in the mixer 48 and the mixed signal is transmitted to the IF filter 42 which is implemented by the micro mechanical filters of FIG. 3. The IF filter 42 is connected to an amplifier 50, and the amplifier 50 is further connected to a receiver LSI chip 3, in which an in-phase (I)/quadrature-phase (Q) demodulation circuit is merged. The receiver LSI chip 3 is connected to an IQ oscillator 57, which is connected to a resonator 58. Through the IF filter 42, difference-frequency between the frequency of the RF signal received at the first antenna 45 and/or the second antenna 46, and the frequency of the RF signal delivered from the local oscillator 49, is extracted so as to be converted into the IF signal. And the IF signal, which is equivalent to the difference-frequency, is amplified and is stabilized by the amplifier 50. The IF signal is I/Q modulated by the receiver LSI chip 3 to I-signal and Q-signal, which are 90° apart in phase. And lower frequencies, such as base-band I-signal and base-band Q-signal of 10 MHz or less, are processed respectively in a mixer 51 and in a mixer 52, which are merged in the receiver LSI chip 3. The base-band I-signal and the base-band Q-signal are amplified respectively by an amplifier 53 and by an amplifier 54, and are transmitted to a base-band filter 43 and a base-band filter 44. Further, the base-band I-signal and the base-band Q-signal which go through the base-band filter 43 and the base-band filter 44, are converted into digital signals by an analog-to-digital (A-D) converter 55 and an A-D converter 56, and are further delivered to a digital base-band processor (DBBP), the illustration of which is omitted. Namely, the base-band I signal which is extracted through the base-band filter 43 is converted to the digital base-band I signal by the A-D converter 55 and is processed by the DBBP. Similarly, the base-band Q signal, which is extracted through the base-band filter 44, is converted to the digital base-band Q signal by the A-D converter 56 so as to be processed by the DBBP.

Figure 6:
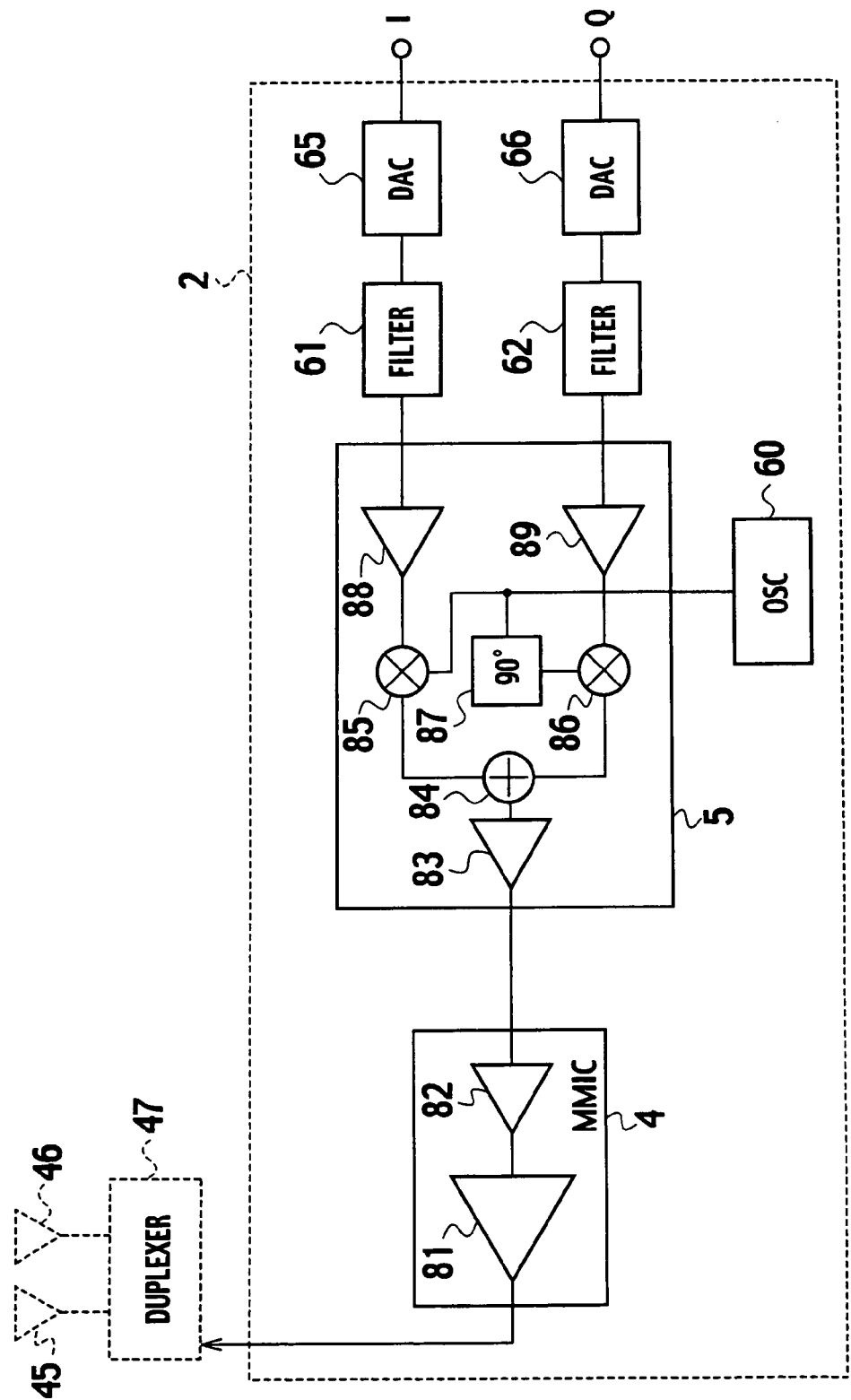
FIG. 6 is a schematic circuit diagram illustrating an example of a transmitter circuit of a portable transceiver implemented by a plurality of FBARs of the first embodiment of the present invention.

FIG. 6 shows a transmitter circuit 2 of the portable transceiver. In the base-band processing unit of the transmitter circuit 2, a digital-to-analog (D-A) converter 65 and a D-A converter 66, which convert digital signal of the base-band I-signal and digital signal of the base-band Q-signal from the DBBP into analog signal, are provided. By the D-A converter 65 and the D-A converter 66, the digital base-band I-signal and the digital base-band Q-signal are converted to the analog base-band I-signal and the analog base-band Q-signal, and are delivered to an amplifier 88 and an amplifier 89 of a modulator LSI chip 5 through a base-band filter 61 and a base-band filter 62.

The modulator LSI chip 5 encompasses the amplifiers 88,89 and mixers 85,86 which are connected to the amplifiers 88,89. In addition, the modulator LSI chip 5 encompasses a phase shifter 87 connected to an oscillator 60. To the mixer 85 and the mixer 86, carrier wave of RF frequency from the oscillator 60 is supplied, the phase of the RF frequency supplied to the mixer 86 is shifted to 90° by the phase shifter 87 from the phase of the RF frequency supplied to the mixer 85. Output of the amplifier 88 is mixed with the carrier wave of the RF frequency from the oscillator 60, and is modulated at the mixer 85. Output of the amplifier 89 is mixed with the phase-shifted carrier wave through the phase shifter 87 from the oscillator 60, and is modulated at the mixer 86. The modulator LSI chip 5 also encompasses an amplifier 83, which is connected to an output terminal of the adder 84. Output of the mixer 85 and the mixer 86 is delivered to the adder 84, and output of the adder 84 is delivered to the amplifier 83. And output of the amplifier 83 is supplied to MMIC 4, which implements the RF front-end unit of the transmitter circuit 2. The MMIC 4 encompasses a power microwave transistor 81 and a power microwave transistor 82 connected in series so as to implement a multi-stage amplification. Output of the MMIC 4 is supplied to the first antenna 45 and the second antenna 46 through the duplexer (antenna switch) 47, after amplification at RF frequency by the power microwave transistors 81,82.

In the portable transceiver shown in FIG. 5 and FIG. 6, since miniaturized micro mechanical filters are used for the RF filter 41 and the IF filter 42 instead of a LC circuit using a cavity resonator and an inductor, a portable transceiver which is miniaturized to a small and thin geometry and operates in a microwave band of about one to five GHz with a low power consumption, can be achieved. Of course, although the FBARs can implement such filters operating at a low frequency band as the base-band filters 43,44 of FIG. 5, or alternatively the base-band filters 61,62 of FIG. 6, etc., it is preferable to use the FBARs in a microwave band over 300 MHz, especially in a microwave band about one to five GHz in view of excellent high-frequency characteristics of the micro mechanical filter shown in FIG. 3.

Second Embodiment

Figure 7:
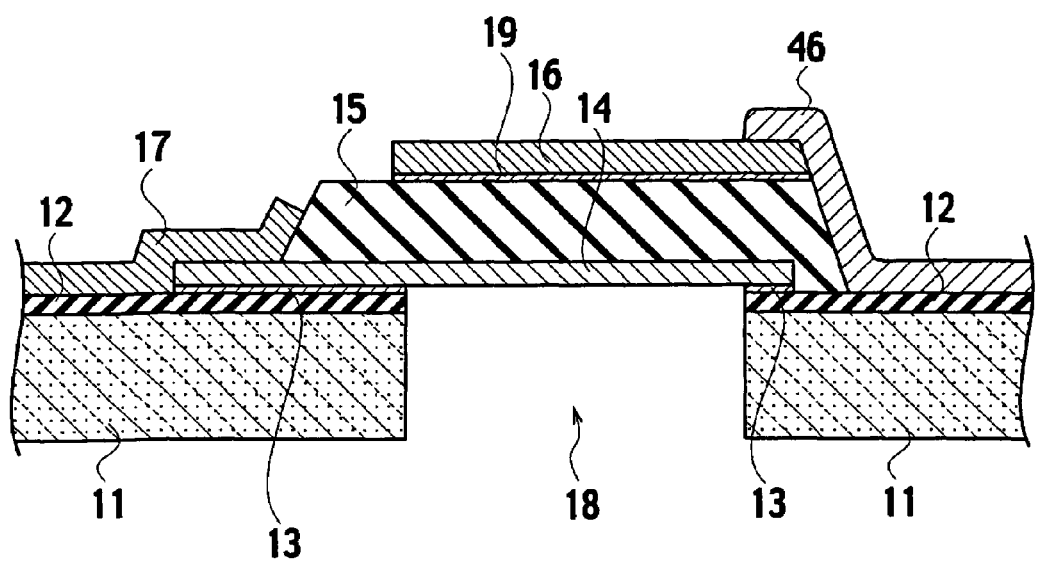
FIG. 7 is a schematic cross sectional view of the FBAR according to a second embodiment of the present invention, corresponding to the similar cross-sectional view taken on line IB-IB in FIG. 1A.

As shown in FIG. 7, a FBAR according to a second embodiment of the present invention encompasses a substrate 11, an insulating film 12 provided on the substrate 11, a bottom electrode 14 provided on the insulating film 12, part of the bottom electrode 14 is mechanically suspended above a cavity (open cavity) 18 formed in the substrate 11 and in the insulating film 12, a piezoelectric layer 15, part of the piezoelectric layer 15 is disposed on part of the bottom electrode 14, a top electrode 16 delineated on the piezoelectric layer 15 and a bottom electrode wiring 17 connected to another part of the bottom electrode 14, the bottom electrode wiring 17 extends to an outside of an occupied area by the piezoelectric layer 15, from a boundary of the piezoelectric layer 15 in a plan view, and a top electrode wiring 46 connected to part of the top electrode 16. The configuration of the FBAR according to the second embodiment is similar to the configuration of the first embodiment in that an amorphous underlying layer (first amorphous underlying layer) 13 is inserted between the top surface of the insulating film 12 and the bottom surface of the bottom electrode 14, at a different site from the area in which the bottom surface of the bottom electrode 14 is laid bare by the cavity 18. For main constituent of the lower amorphous underlying layer 13, materials such as a Ta—Al alloy film and a $TiB_2$ film having about five to 100 nm film thickness, or preferably about 15 to 30 nm film thickness, can be adopted. However, the configuration of the FBAR according to the second embodiment of the present invention is different from the configuration of the FBAR of the first embodiment in that an upper amorphous underlying layer (second amorphous underlying layer) 19, the main constituent of the upper amorphous underlying layer 19 is formed of materials such as a Ta—Al alloy film and a $TiB_2$ film having about five to 100 nm film thickness, or preferably about 15 to 30 nm film thickness, is further inserted between the top surface of the piezoelectric layer 15 and the bottom surface of the top electrode 16. Similar to the FBAR of the first embodiment, the FBAR of the second embodiment utilizes bulk vibration along the thickness direction of the piezoelectric layer 15.

The top electrode 16 has aligned crystal axes oriented along the thickness direction of the piezoelectric layer 15. The orientations of the crystal axes in the top electrode 16 along the peak crystal axis is set such that the FWHM of distribution of the orientations in the top electrode 16 along the peak crystal axis is smaller than or equal to about six degrees, or preferably smaller than or equal to about four degrees, and more preferably smaller than or equal to about three degrees. Since the smaller the FWHM is, the higher the crystallographic quality of the top electrode 16, and a higher electromechanical coupling factor $k_t^2$ and a higher Q-value can be achieved. In the FBAR of the second embodiment, since the upper amorphous underlying layer 19 is inserted between the top surface of the piezoelectric layer 15 and the bottom surface of the top electrode 16, the FWHM in the distribution of the orientations can be set at preferably smaller than or equal to about four degrees and more preferably smaller than or equal to about three degrees with ease.

Similar to the FBAR of the first embodiment, it is preferable that the top electrode 16 of the FBAR according to the second embodiment may be mainly formed of metallic materials having about 600 to 2300 degrees C. melting point. Especially, when the main constituent of the top electrode 16 is formed of metallic materials having melting points in the range from about 600 to 2300 degrees C. with the bulk resistivity smaller than and equal to about 15 micro-ohm-centimeters, the increase in resistivity due to the crystal defects is negligible, because the melting points of the metallic materials are high enough so as to ensure a high crystallographic quality. And, surface morphology becomes excellent in the process of thin film formation due to the high melting point.

More specifically, it is preferable that the top electrode 16 is mainly formed of such metallic materials as Co and Ru having <0001> orientation, or alternatively, it is preferable that the electrode material for the top electrode 16 is selected from the group consisting of Al, Cr, Fe, Ni, Cu, Pt, Rh and Pd having <111> orientation. Although the elastic constant and the acoustic impedance of the above-listed metallic materials are lower, compared with refractory metals such as Mo, W and Ir lying out of the melting point range from about 600 to 2300 degrees C., because the orientations of the crystal axes in the top electrode 16 of the FBAR according to the second embodiment, can be easily aligned along a specific direction such that the FWHM in the distribution of the orientations in the top electrode 16 along the peak crystal axis is smaller than or equal to about four degrees and preferably smaller than or equal to about three degrees, the elastic constant of the top electrode 16 becomes maximum along the specific direction, so as to suppress the decrease in the electromechanical coupling factor $k_t^2$ of the top electrode. As explained in the FBAR of the first embodiment, if metallic thin films for the top electrode 16, formed of metallic materials lying in the melting point range from about 600 to 2300 degrees C., are grown at the same growth temperature, the lower the melting point of material, the larger the grain size of the metallic thin film. Therefore, a high crystallographic quality of the top electrode 16 can be achieved and a resistivity of the metallic thin film becomes approximately equivalent to the resistivity of bulk, by adopting the metallic materials having a melting point of about 600 to 2300 degrees C. In other words, by selecting the metallic materials with a melting point of about 600 to 2300 degrees C. for the materials of the top electrode 16, the grain size of the top electrode 16 becomes large and the scattering of carriers by the grain boundary is decreased. Also, since a high crystallographic quality of the top electrode 16 is achieved, the scattering of carriers by crystal defects of the metallic thin film can be decreased. As the resistivity and the series resistance in the top electrode 16 of the FBAR is decreased, the electromechanical coupling factor $k_t^2$ and the Q-value increase.

Especially, when metallic materials having high acoustic impedance, such as a Ta—Al alloy film is adopted for the material of the upper amorphous underlying layer 19 inserted between the top surface of the piezoelectric layer 15 and the bottom surface of the top electrode 16, not only the orientations of the crystal axes in the top electrode 16 are improved, but also the electromechanical coupling factor $k_t^2$ is effectively increased. By making use of the multiplying effect of the decrease of the resistivity in the top electrode 16 and the decrease of the series resistance in the top electrode 16 of the FABA of the second embodiment, a higher electromechanical coupling factor $k_t^2$ and a higher Q-value is achieved. In this manner, in the FBAR according to the second embodiment, by selecting the metallic materials having a melting point of about 600 to 2300 degrees C. for the top electrode 16, and by orientating the top electrode 16 in a direction along which the elastic constant of the top electrode 16 increases most, acoustic impedance increases, which can prevent the bulk vibration of the piezoelectric layer from propagating to the top electrode 16. Further, since the series resistance in the top electrode 16 is decreased, the FBAR having a high Q-value and a high effective electromechanical coupling factor $k_t^2$ can be achieved. And note that while the above-explanations were made with regard to the top electrode 16, the same explanations will be applied to the bottom electrode 14 in theory.

Similar to the FBAR of the first embodiment, according to an evaluation by a measurement using a vector network analyzer (HP8510C), the FBAR of the second embodiment, encompassing a lower amorphous underlying layer 13 formed of a Ta—Al alloy film with about 20 nm film thickness, a bottom electrode 14 formed of an Al film with about 300 nm film thickness, a piezoelectric layer 15 formed of an AlN film with about 1.7 micrometers film thickness, an upper amorphous underlying layer 19 formed of a Ta—Al alloy film with about 20 nm film thickness, a top electrode 16 formed of an Al film with about 300 nm film thickness shows an excellent electromechanical coupling factor $k_t^2$ of 6.7%, and the Q-value at the resonance frequency is 850, and the Q-value at the anti-resonance frequency is 750, which are the same result with the resonance characteristics of the FBAR of the first embodiment. The film thickness of the piezoelectric layer 15 is decreased to 1.7 micrometers so as to suppress the increase in mass load of the top electrode with the upper amorphous underlying layer 19.

As will be explained hereinafter, the FBAR according to the second embodiment can be manufactured so as to achieve the top electrode 16 having a small FWHM in the distribution of the orientations and an excellent crystallographic quality, through a sequence of manufacturing processes in which on the bottom electrode 14, the piezoelectric layer 15, the upper amorphous underlying layer 19 and the top electrode 16 are successively deposited in order, and after patterns of the top electrode 16 and the upper amorphous underlying layer 19 are delineated, a pattern of the piezoelectric layer 15 is delineated.

With reference to FIGS. 8A-8D, a sequence of manufacturing processes of the FBAR according to the second embodiment is explained. Note that the FBAR of the second embodiment can be manufactured by various manufacturing methods such as a modification of the second embodiment, other than the sequence of manufacturing processes disclosed by the following example.

Figure 8A:
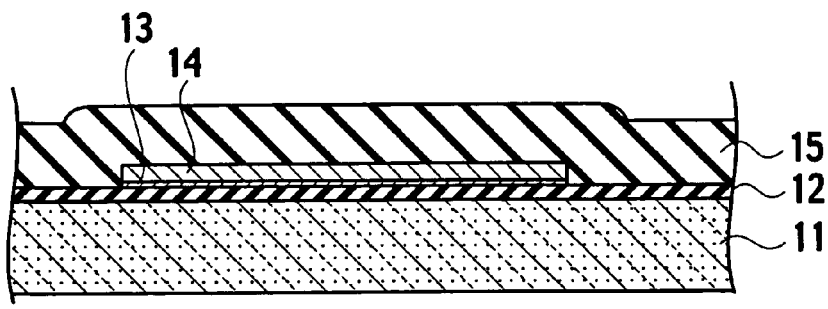
FIG. 8A is a process flow cross sectional view showing an intermediate product of the FBAR corresponding to the similar cross sectional view taken on line IB-IB in FIG. 1, explaining a manufacturing method of the FBAR according to the second embodiment.

(a) By the same manufacturing process sequences of the FBAR of the first embodiment shown in FIGS. 2A to 2C, a cross-sectional structure having a substrate 11, an insulating film 12 on the substrate 11, a lower amorphous underlying layer 13 on the insulating film 12, a bottom electrode 14 on the lower amorphous underlying layer 13 and a piezoelectric thin film 15 on the bottom electrode 14, is formed as shown in FIG. 8A. In the process, a first amorphous thin film (a mother material film for the lower amorphous underlying layer) 13 and a first metallic film (a mother material film for the bottom electrode) 14 are delineated so that a length of a laminated structure implemented by the bottom electrode 14 and the lower amorphous underlying layer 13 is made shorter than the length of the bottom electrode 14 and the lower amorphous underlying layer 13 of the first embodiment already shown in FIG. 2B. Afterwards, as shown in FIG. 8A, a piezoelectric thin film 15 having about 0.5 to three micrometers film thickness is deposited by RF magnetron sputtering method, etc, so that the piezoelectric thin film 15 can cover entire faces of the bottom electrode 14 and the insulating film 12. The thickness of the piezoelectric thin film 15 varies by resonance frequencies, and the thickness of the material film may be determined at about 1.7 micrometers, if the piezoelectric thin film is AlN and if the resonance frequency is designed to be about two GHz.

Figure 8B:
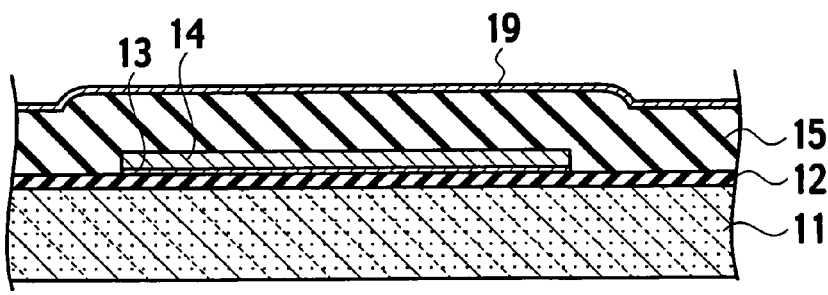
FIG. 8B is a subsequent process flow cross sectional view showing the intermediate product of the FBAR according to the second embodiment after the process stage shown in FIG. 8A.

(b) Subsequently, on the piezoelectric thin film 15, a second amorphous thin film (a mother material metallic film for the upper amorphous underlying layer) 19 having about five to 100 nm film thickness, or preferably about ten to 30 nm film thickness, is deposited using RF magnetron sputtering, etc, as shown in FIG. 8B. For instance, a Ta—Al alloy film for the upper amorphous underlying layer 19, can be deposited using Ta and Al targets and argon gas, at a substrate temperature of room temperature by RF magnetron sputtering, etc.

Figure 8C:
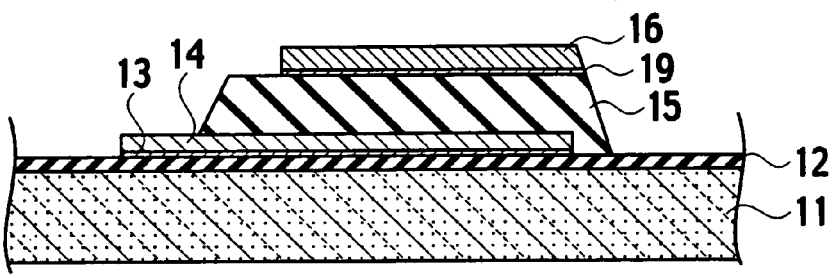
FIG. 8C is a subsequent process flow cross sectional view showing the intermediate product of the FBAR according to the second embodiment, after the process stage shown in FIG. 8B.

(c) Afterwards, a second metallic film (a mother material metallic film for the top electrode) 16 having about 150 to 600 nm film thickness, or preferably about 250 to 350 nm film thickness, is deposited so that the second metallic film 16 can cover an entire surface of the piezoelectric thin film 15 through the second amorphous thin film 19. For instance, the piezoelectric thin film 15, the second amorphous thin film 19, an Al film (second metallic film) 16 with about 300 nm film thickness are deposited successively in the same deposition chamber (vacuum chamber) of the same fabrication tool (sputtering tool) without exposure to the air, by a reactive RF magnetron sputtering method. Subsequently the metallic film (the Al film) 16 is delineated by photolithography and an accompanying wet etching using a non-oxidizing acid solution such as HCl solution, so as to form a pattern of the top electrode 16. And in the case where using a Ta—Al alloy film for the upper amorphous underlying layer 19, the Ta—Al alloy film can be selectively etched by RIE method with fluoride based etching gas, such as $C_4F_8$, and subsequently, a pattern of the amorphous underlying layer 19 is delineated. After the process, the piezoelectric thin film 15 is delineated by photolithography and an accompanying RIE method with chloride based etching gas so as to form a pattern of the piezoelectric layer 15 as shown in FIG. 8C.

Figure 8D:
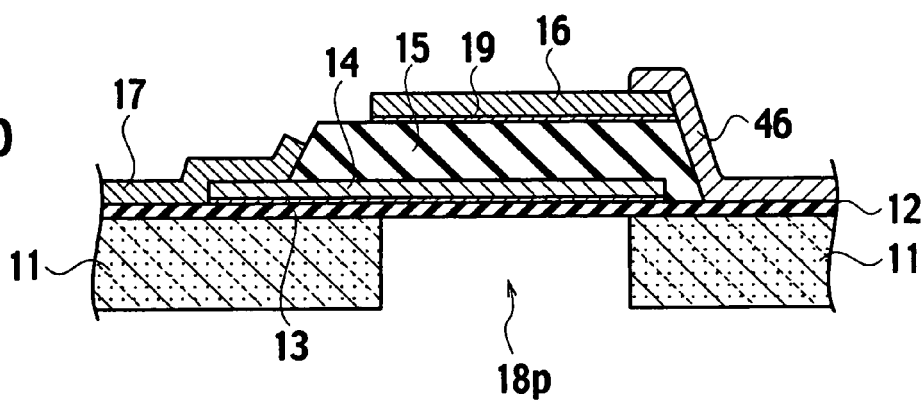
FIG. 8D is a further subsequent process flow cross sectional view showing the intermediate product of the FBAR according to the second embodiment after the process stage shown in FIG. 8C.

(d) Afterwards, a metallic film having about 150 to 600 nm film thickness, or preferably about 250 to 350 nm film thickness, is deposited so that the metallic film can cover the entire surface including the top electrode 16, the piezoelectric layer 15 laid bare from the edge of the top electrode 16, the bottom electrode 14 laid bare from the edge of the piezoelectric layer 15, and the insulting film 12. Afterwards the metallic film is delineated by photolithography and selectively etched so as to form patterns of the top electrode wiring 46 and the bottom electrode wiring 17. In the case where using an Al film for the metallic film and an AlN film for the piezoelectric layer 15, the Al film is selectively etched so that the top electrode 16 is not over-etched by the wet etching using a non-oxidizing acid solution such as HCl solution, so as to delineate the top electrode wiring 46 and the bottom electrode wiring 17. To prevent the over-etching of the top electrode 16, metallic materials having a different etch selectivity from the Al film, such as Co, Ru, Cr, Fe, Ni, Cu, Pt, Rh and Pd, may be used for the material of the top electrode 16. Or alternatively, on the top electrode 16 formed of an Al film, an etching stopper layer formed of metallic materials having a different etch selectivity from the Al film, such as Ta, Mo and W can be formed so as to implement a double-layer. Through the process, the bottom electrode wiring 17 is electrically connected to the bottom electrode 14 laid bare from the edge of the piezoelectric layer 15, and the top electrode wiring 46 is electrically connected to the top electrode 16. Afterwards, the thickness of the substrate 11 is adjusted to 60 to 300 nm, preferably to 80 to 250 nm. For instance, the thickness of the substrate 11 is adjusted up to 100 nm by polishing. Afterwards, an etching-mask is delineated on the bottom surface of the substrate 11 by photolithography. In the case where using a Si substrate for the substrate 11, the substrate 11 is etched from the bottom surface by RIE method with fluoride based etching gas, so as to establish the cavity (through-hole) 18p as shown in FIG. 8D.

(e) Afterwards, the insulting film 12 and the lower amorphous underlying layer 13 formed at the bottom of the cavity (through-hole) 18p, are removed using wet etching and an accompanying RIE method with fluoride based etching gas, so as to complete the sequence of formation processes, and the cross-sectional structure shown in FIG. 7 is achieved.

According to the manufacturing method of the FBAR of the second embodiment, since the piezoelectric thin film 15, the second amorphous thin film (mother material metallic film for the upper amorphous underlying layer) 19 and the second metallic film (mother material metallic film for the top electrode) 16 can be deposited successively in the same deposition chamber (vacuum chamber) of the same fabrication tool (sputtering tool) without exposure to the air, an excellent morphology at a boundary surface between the piezoelectric layer 15 and the upper amorphous underlying layer 19 and an excellent morphology at a boundary surface between the upper amorphous underlying layer 19 and the top electrode 16 can be achieved. By the formation process, high crystallographic quality of the top electrode 16 is achieved which easily enables the FWHM of distribution of the orientations in the top electrode 16 along the peak crystal axis to be smaller than or equal to about four to three degrees. Therefore, according to the manufacturing method of the FBAR of the second embodiment, the FBAR having large technical advantages such that the series resistance in the electrodes is low, thin films of the electrodes are not subject to residual stress and the electromechanical coupling factor $k_t^2$ is high, can be achieved with ease.

The FBAR according to the second embodiment can implement the ladder-type filter 41 shown in FIG. 3 and a semiconductor integrated circuit such as the VCO of mobile communication devices shown in FIG. 4 as mentioned in the first embodiment. Also a plurality of FBARs of the second embodiment can be employed in the portable transceiver shown in FIG. 5 and FIG. 6, so as to implement the micro mechanical filters for the RF filter 41 and the IF filter 42.

Third Embodiment

Figure 9A:
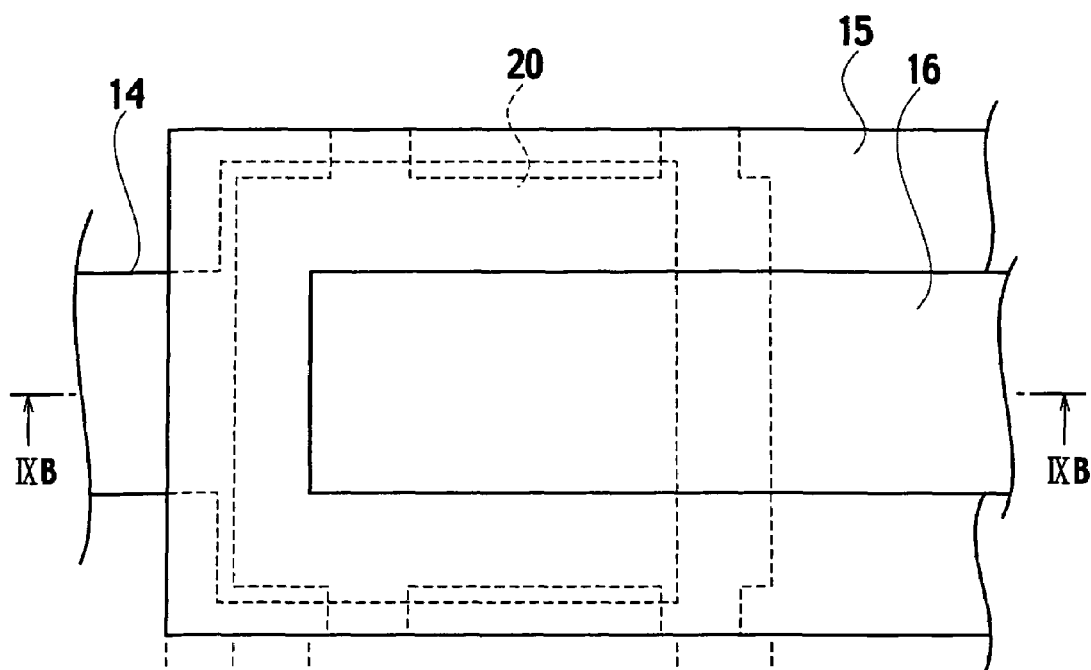
FIG. 9A is a schematic plan view of a FBAR according to a third embodiment of the present invention.
Figure 9B:
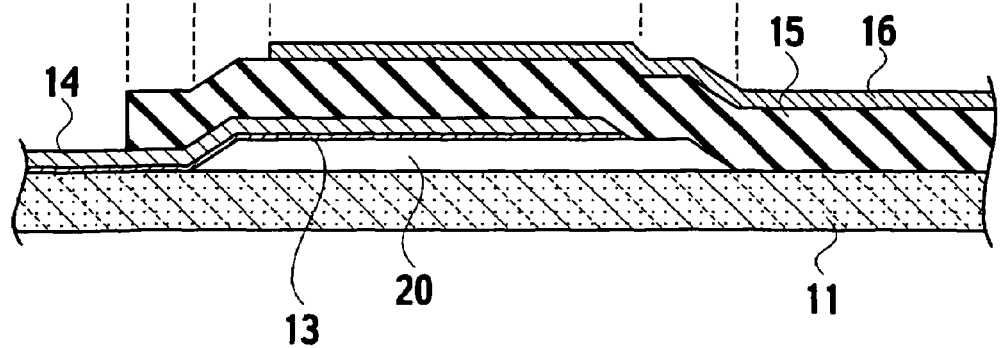
FIG. 9B is a schematic cross sectional view of the FBAR according to the third embodiment, taken on line IXB-IXB in FIG. 9A.

As shown in FIGS. 9A and 9B, a FBAR according to a third embodiment of the present invention encompasses a substrate 11, a bottom electrode 14 provided on the substrate 11, part of the bottom electrode 14 is mechanically suspended above a cavity (hollow) 20 formed on the substrate 11, a piezoelectric layer 15 provided on the bottom electrode 14, a top electrode 16 provided on the piezoelectric layer 15. The FBAR according to the third embodiment is similar to the FBARs of the first to second embodiments in that the FBAR utilizes bulk vibration along the thickness direction of the piezoelectric layer 15, and that the top electrode 16 has aligned crystal axes oriented along the thickness direction of the piezoelectric layer 15. The orientations of the crystal axes in the top electrode 16 along the peak crystal axis is set such that the FWHM of distribution of the orientations in the top electrode 16 along the peak crystal axis is smaller than or equal to about six degrees, or preferably smaller than or equal to about four degrees, and more preferably smaller than or equal to about three degrees. Since the smaller the FWHM is, the higher the crystallographic quality of the top electrode 16, a higher electromechanical coupling factor $k_t^2$ and a higher Q-value can be achieved.

As shown by a dashed line in a plan view of FIG. 9A, an area (cavity area) occupied by the cavity 20, is defined in the inside of a bottom electrode area occupied by the bottom electrode 14, except for branch members of the cavity 20, four branch members are extending perpendicular to the sides of the cavity 20. And as shown in a cross sectional view of FIG. 9B, the cavity 20 is a quasi-closed cavity, or a partially closed hollow having a trapezoidal cross-sectional view, with an upwards convex configuration. A lower amorphous underlying layer 13 is inserted between the top surface of the substrate 11 and the bottom surface of the bottom electrode 14. The lower amorphous underlying layer 13 extends along the bottom surface of the bottom electrode 14, which is laid bare on the cavity 20. The remaining area not occupied by the pattern of a double layer implemented by the bottom electrode 14 and the lower amorphous underlying layer 13 in a plan view shown in FIG. 9A, the piezoelectric thin film 15 is directly provided on the substrate 11 in the remaining area. For materials of the lower amorphous underlying layer 13, materials such as a Ta—Al alloy film and a $TiB_2$ film having about five to 100 nm film thickness, or preferably about 15 to 30 nm film thickness, can be adopted. Therefore, part of the bottom surface (belly) of a double-layer structure implemented by the bottom electrode 14 and the lower amorphous underlying layer 13, is laid bare in the trapezoidal cavity 20, at one of the slanting faces and a ceiling (upper base) of the trapezoidal cavity 20, and part of the double-layer structure is suspended above the trapezoidal hollow.

In the FBAR shown in FIG. 9, resonance frequency can be determined by adjusting the film thicknesses of the piezoelectric layer 15, the bottom electrode 14 and the top electrode 16, since the FBAR utilizes a bulk vibration along the thickness direction of the piezoelectric layer 15. With the lower amorphous underlying layer 13, when AlN, or alternatively zinc oxide (ZnO) having a wurtzite lattice structure are employed to implement the piezoelectric layer 15, orientations of the crystal axes in the piezoelectric layer 15 are easily controlled uniformly along the c-axis of a hexagonal lattice structure, or along <0001> direction. By controlling the polarization directions (orientations of the crystal axes) of the piezoelectric layer 15 to the c-axis, a higher electromechanical coupling factor $k_t^2$ and a higher Q-value are easily achieved in the piezoelectric layer 15.

Similar to the FBARs of the first to second embodiments, it is preferable that the top electrode 16 of the FBAR according to the third embodiment is mainly formed of metallic materials having about 600 to 2300 degrees C. melting point. Especially, when the main constituent of the top electrode 16 is formed of metallic materials having melting points in the range from about 600 to 2300 degrees C. with bulk resistivity smaller than and equal to about 15 micro-ohm-centimeters, the increase in resistivity due to the crystal defects is negligible, because the melting points of the metallic materials are high enough so as to ensure a high crystallographic quality. And, surface morphology becomes excellent in the process of thin film fabrication due to the high melting point. More specifically, it is preferable that the electrode material for the top electrode 16 is selected from the group consisting of Co and Ru having <0001> orientation, or alternatively, Al, Cr, Fe, Ni, Cu, Pt, Rh and Pd having <111> orientation. Although the elastic constant and the acoustic impedance of the above-listed metallic materials are lower, compared with refractory metals such as Mo, W and Ir lying out of the melting point range from about 600 to 2300 degrees C., because the orientations of the crystal axes in the top electrode 16 of the FBAR according to the third embodiment, can be easily aligned along a specific direction such that the FWHM in the distribution of the orientations in the top electrode 16 along the peak crystal axis is smaller than or equal to about six degrees, the elastic constant of the top electrode 16 becomes maximum along the specific direction, so as to suppress the decrease in the electromechanical coupling factor $k_t^2$ of the top electrode 16. As explained in the FBAR of the first embodiment, if metallic thin films for the top electrode 16, formed of metallic materials lying in the melting point range from about 600 to 2300 degrees C., are grown at the same growth temperature, the lower the melting point of material, the larger the grain size of the metallic thin film. Therefore, a high crystallographic quality of the top electrode 16 can be achieved and a resistivity of the metallic thin film becomes approximately equivalent to the resistivity of bulk, by adopting the metallic materials having a melting point of about 600 to 2300 degrees C. In other words, by selecting the metallic materials with a melting point of about 600 to 2300 degrees C. for the materials of the top electrode 16, the grain size of the top electrode 16 becomes large and the scattering of carriers by the grain boundary is decreased. Also, since a high crystallographic quality of the top electrode 16 is achieved, the scattering of carriers by crystal defects of the metallic thin film can be decreased. As the resistivity and the series resistance in the top electrode 16 of the FBAR is decreased, the electromechanical coupling factor $k_t^2$ and the Q-value increase.

In this manner, in the FBAR according to the third embodiment, by selecting the metallic materials having a melting point of about 600 to 2300 degrees C. for the top electrode 16, and by orientating the top electrode 16 in a direction along which the elastic constant of the top electrode 16 increases most, acoustic impedance increases, which can prevent the bulk vibration of the piezoelectric layer 15 from propagating to the top electrode 16. Further, since the series resistance in the top electrode 16 is decreased, the FBAR having a high Q-value and a high effective electromechanical coupling factor $k_t^2$ can be achieved. And note that the above-explanations were made with regard to the top electrode 16, and the same explanations will be applied to the bottom electrode 14 in theory.

For instance, the FBAR of the third embodiment, encompassing a lower amorphous underlying layer 13 formed of a Ta—Al alloy film with about 20 nm film thickness, a bottom electrode 14 formed of an Al film with about 300 nm film thickness, a piezoelectric layer 15 formed of an AlN film with about 1.6 micrometers film thickness, a top electrode 16 formed of a Co film with about 300 nm film thickness shows excellent resonance characteristics such that at a resonance frequency of about 1.9 GHz, the electromechanical coupling factor $k_t^2$ is 6.6%, the Q-value at the resonance frequency is 750, and the Q-value at the anti-resonance frequency is 730, according to an evaluation by a measurement using a vector network analyzer (HP8510C). Also spurious vibration was hardly observed either. And the series resistance in the electrodes of the FBAR is found to be below 0.5 ohm by a parameter fitting in the frequency dependence of the impedance, in a wide measurement range of impedance from 0.1 to 10 GHz. Further, rupture and cracking of the hollow structure in the FBAR of the third embodiment due to the residual stress could not be observed either.

With reference to FIGS. 10A to 13B, a sequence of manufacturing processes of the FBAR according to the third embodiment is explained. Note that the FBAR of the third embodiment can be manufactured by various manufacturing methods such as a modification of the third embodiment, other than the sequence of manufacturing processes disclosed by the following example.

Figure 10A:
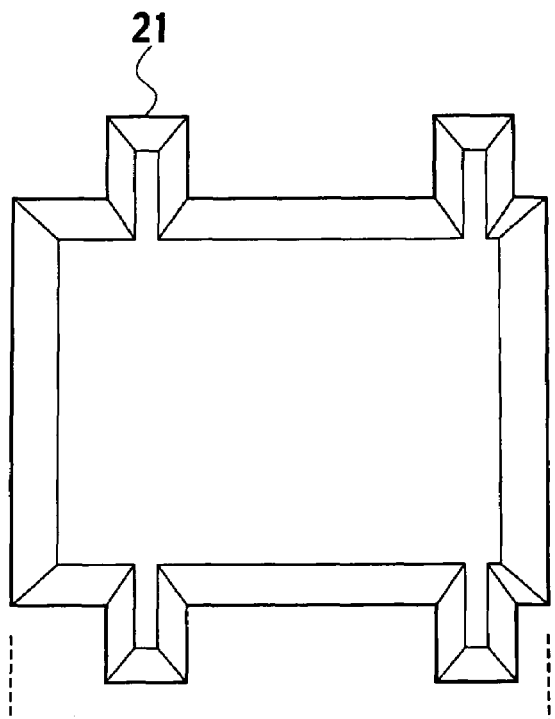
FIG. 10A is a process flow plan view showing an intermediate product of the FBAR, explaining a manufacturing method of the FBAR according to the third embodiment.
Figure 10B:
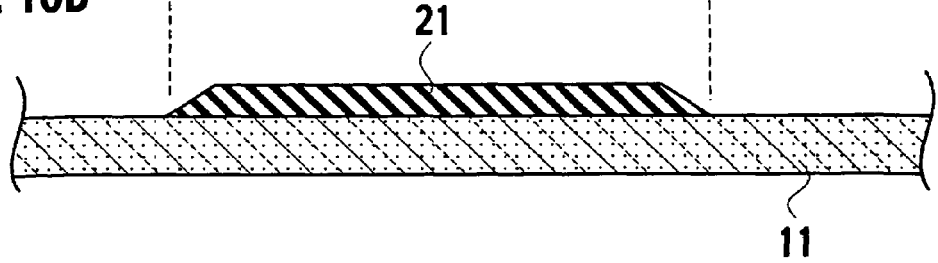
FIG. 10B is a process flow cross sectional view showing the intermediate product of the FBAR corresponding to the similar cross sectional view taken on line DXB-DB in FIG. 9A, explaining the manufacturing method of the FBAR according to the third embodiment.

(a) First, on a Si (100) substrate 11, a Mo film having about 0.5 to 2 micrometers film thickness, or preferably about 0.8 to 1.5 micrometers film thickness, for instance, a one micrometer film thickness is deposited using RF magnetron sputtering, etc. And the Mo film is delineated by photolithography and an accompanying chemical dry etching (CDE) method with fluoride based etching gas, so as to form a pattern of a Mo sacrificial layer 21 as shown in FIGS. 10A and 10B. A cross-sectional view of the Mo sacrificial layer 21 is a trapezoidal configuration as shown in FIG. 10B, and a planar shape of the Mo sacrificial layer 21 is a rectangular pattern in which four branch members of striped configuration are established so that the four branch members of striped configuration are orthogonal to the sides of the rectangular pattern, as shown in FIG. 10A. The number of branch members is not limited to four, one to three branch members, or alternatively more than five branch members may be established to the sides of the rectangular pattern.

Figure 11A:
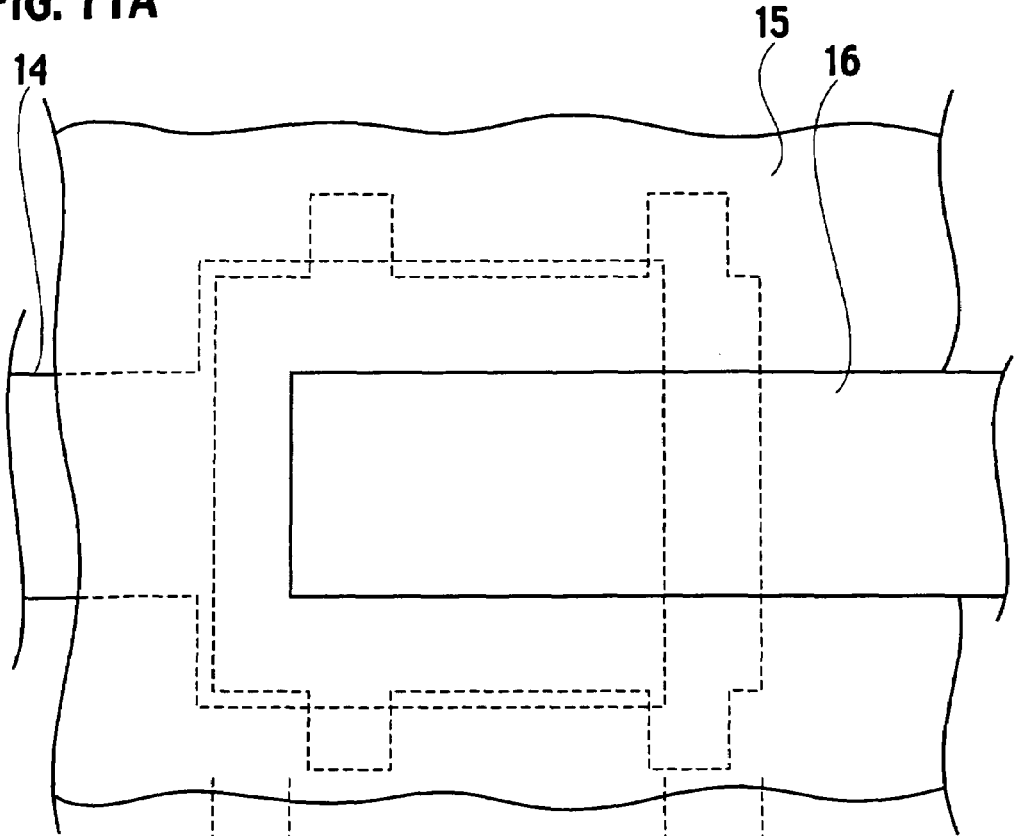
FIG. 11A is a subsequent process flow plan view showing the intermediate product of the FBAR according to the third embodiment after the process stage shown in FIG. 10A.
Figure 11B:
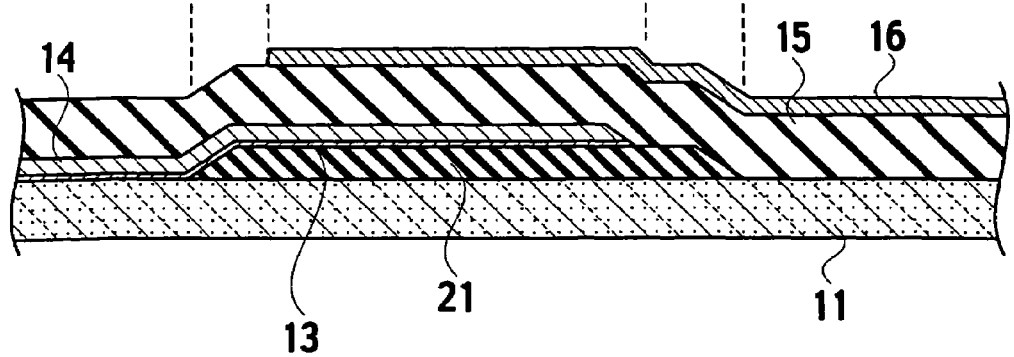
FIG. 11B is a subsequent process flow cross sectional view showing the intermediate product of the FBAR according to the third embodiment after the process stage shown in FIG. 10B.

(b) Next, on the sacrificial layer 21, a first amorphous thin film (a mother material metallic film for the lower amorphous underlying layer) 13 having about a five to 100 nm film thickness, or preferably about ten to 30 nm film thickness, and a first metallic film (the mother material metallic film for the bottom electrode) 14 such as an Al film, having about 150 to 600 nm film thickness, or preferably about 250 to 350 nm film thickness, are deposited successively. The first amorphous thin film 13 and the first metallic film 14 can be deposited successively in the same deposition-chamber. And the first amorphous thin film 13 and the first metallic film 14 are delineated by photolithography and an accompanying RIE method so as to form a pattern of a double layer implemented by the bottom electrode 14 and the lower amorphous underlying layer 13 under the bottom electrode 14 as shown in FIGS. 11A and 11B. Afterwards, on the bottom electrode 14, a piezoelectric thin film, having a wurtzite lattice structure with about 0.5 to three micrometers thickness is deposited by RF magnetron sputtering method, etc. The thickness of the piezoelectric thin film varies by resonance frequencies, and the thickness of the mother material film may be determined at about 1.6 micrometer, if the piezoelectric thin film is AlN and if the resonance frequency is designed to be about 1.9 GHz. Further, on the piezoelectric thin film, a second metallic film (a mother material metallic film for the top electrode) 16 having about 150 to 600 nm film thickness, or preferably about 250 to 350 nm film thickness, is deposited successively. For instance, a Co film for the second metallic film 16 having about 300 nm film thickness and the piezoelectric thin film 15 can be deposited successively in the same deposition chamber (vacuum chamber) of the same fabrication tool (sputtering tool) without exposure to the air. Subsequently, the Co film (second metallic film) 16 is delineated and selectively etched by photolithography and an accompanying RIE method so as to form a pattern of the top electrode 16 as shown in FIGS. 11A and 11B.

(c) Then, the piezoelectric thin film 15 is delineated by photolithography and an accompanying RIE method with chloride based etching gas so as to form a pattern of the piezoelectric layer 15. As shown in the cross-sectional view of FIG. 12B, the pattern of the piezoelectric layer 15 is delineated such that one of the end faces of the piezoelectric layer 15 (on the left side of FIG. 12B) may be located on the bottom electrode 14, and part of the bottom electrode 14 comes to show up from the edge of the piezoelectric layer 15. Further, in the plan view of FIG. 12A, the branch members of striped configuration established at the sides of the rectangular pattern of the sacrificial layer 21, come to show up from the edge of the end faces of the piezoelectric layer 15.

(d) Afterwards, the branch members of striped configuration established to the sides of the rectangular pattern of the sacrificial layer 21, being laid bare from the edge of the end faces of the piezoelectric layer 15, are etched by submerging the substrate 11 in hydrogen peroxide ($H_2O_2$) solution, the temperature of which is set at seventy-five degrees C. As etching of the branch members in the striped configuration proceeds, a conduit of the etching solution to the Mo sacrificial layer 21, which is buried under the bottom surface (belly) of the piezoelectric layer 15, is formed. And the Mo sacrificial layer 21 is etched through the conduit of the etching solution, so as to form a pattern of the cavity 20 shown in FIGS. 9A and 9B. After the etching by using the $H_2O_2$ solution, rinsed by isopropyl alcohol and dried, the cross-sectional structure of the FBAR of the third embodiment is completed.

As mentioned above, according to the manufacturing method of the FBAR of the third embodiment, the FBAR having large technical advantages such that the series resistance in the electrodes is low, thin films of the electrodes are not subject to residual stress and the electromechanical coupling factor $k_t^2$ is high, can be achieved with ease. In the manufacturing method of the FBAR of the third embodiment, an evaluation in which a FWHM of distribution of the orientations in the top electrode 16 along the peak crystal axis was measured in a rocking curve of X-ray diffraction, before the Mo sacrificial layer 21 is etched, shows an excellent crystallographic quality of the top electrode 16, at 2.2 degrees in a FWHM of the distribution of <0001> orientations of the crystal axes in the top electrode 16.

On the contrary, according to another manufacturing method of a FBAR in which a pattern of the piezoelectric layer 15 formed of an AlN film is delineated first, and afterwards, a pattern of the top electrode 16 with about 300 nm film thickness is delineated by a "lift-off process" through a process submerging the substrate 11 in an alkaline-based developer solution, surface roughness of the piezoelectric layer 15 occurs and film uniformity of the top electrode 16 deteriorates due to the use of the alkaline based developer solution. When an evaluation of the FBAR manufactured by the above-mentioned lift-off method is measured using a vector network analyzer, after the cavity 20 is formed, resonance characteristics of the FBAR became low such that although the electromechanical coupling factor $k_t^2$ is 6.6%, the Q-value at the resonance frequency is 400, and the Q-value at the anti-resonance frequency is 340. The Q-value of the FBAR by the lift-off method is lower than the FBAR of the third embodiment in which films of the piezoelectric thin film 15 and the mother material metallic film for the top electrode 16 are deposited successively.

According to the manufacturing method of the FBAR of the third embodiment, since the piezoelectric thin film 15 and the second metallic film (mother material metallic film for the top electrode) 16 can be deposited successively in the same deposition chamber (vacuum chamber) of the same fabrication tool (sputtering tool) without exposure to the air, excellent morphologies at a boundary surface between the piezoelectric layer 15 and the top electrode 16 can be achieved. By the fabrication process, high crystallographic quality of the top electrode 16 is achieved which easily enables the FWHM of distribution of the orientations in the top electrode 16 along the peak crystal axis to be smaller than or equal to about six degrees. Therefore, according to the manufacturing method of the FBAR of the third embodiment, the FBAR having large technical advantages such that the series resistance in the electrodes is low, thin films of the electrodes are not subject to residual stress and the electromechanical coupling factor $k_t^2$ is high, can be achieved with ease.

The FBAR according to the third embodiment can implement the ladder-type filter 41 shown in FIG. 3 and a semiconductor integrated circuit such as the VCO of mobile communication devices shown in FIG. 4 as mentioned in the first embodiment. Also a plurality of FBARs of the third embodiment can be employed in the portable transceiver shown in FIG. 5 and FIG. 6, so as to implement the micro mechanical filters for the RF filter 41 and the IF filter 42.

Although the lower amorphous underlying layer 13 is directly provided on the substrate 11 in FIGS. 9B, 10B, 11B, and 12B, an insulating film 12 may be inserted between the lower amorphous underlying layer 13 and the substrate 11 similar to the configurations explained in the first and second embodiments. In this modified case, in the remaining area not occupied by the pattern of a double layer implemented by the bottom electrode 14 and the lower amorphous underlying layer 13 in the plan view shown in FIG. 9A, the piezoelectric thin film 15 is directly provided on the insulating film 12 in the remaining area.

Modification of the Third Embodiment

As shown in FIGS. 13A and 13B, a FBAR according to a modification of the third embodiment of the present invention encompasses a substrate 11, a bottom electrode 14 provided on the substrate 11, part of the bottom electrode 14 is mechanically suspended above a cavity (hollow) 20 formed on the substrate 11, a piezoelectric layer 15 provided on part of the bottom electrode 14, making bare other part of the bottom electrode 14 from the edge of the piezoelectric layer 15, a top electrode 16 provided on the piezoelectric layer 15, a bottom electrode wiring 17 connected to part of the bottom electrode 14, the bottom electrode wiring 17 extends to an outside of an area occupied by the piezoelectric layer 15, from a boundary of the piezoelectric layer 15 in a plan view, and a top electrode wiring 46 connected to part of the top electrode 16. Although the FBAR of the modification of the third embodiment includes a similar configuration to the FBAR shown in FIGS. 9A and 9B in that a lower amorphous underlying layer (first amorphous underlying layer) 13 is provided along the bottom surface of the bottom electrode 14, the FBAR of the modification of the third embodiment encompasses further an upper amorphous underlying layer (second amorphous underlying layer) 19, inserted between the top surface of the piezoelectric layer 15 and the bottom surface of the top electrode 16 and formed of materials such as a Ta—Al alloy film and a $TiB_2$ film having about five to 100 nm film thickness, or preferably about 15 to 30 nm film thickness. In the FBAR of the modification of the third embodiment, since the upper amorphous underlying layer 19 is inserted between the top surface of the piezoelectric layer 15 and the bottom surface of the top electrode 16, the FWHM in the distribution of the orientations can be set at preferably smaller than or equal to about four degrees and more preferably smaller than or equal to about three degrees with ease.

Especially, when metallic materials having high acoustic impedance, such as a Ta—Al alloy film is inserted between the top surface of the piezoelectric layer 15 and the bottom surface of the top electrode 16, for the second amorphous thin film (mother material film for the upper amorphous underlying layer) 19, not only the orientations of the crystal axes in the top electrode 16 are improved, but also the electromechanical coupling factor $k_t^2$ is effectively increased. By making use of the multiplying effect of the decrease of the resistivity of the top electrode 16 and the decrease of the series resistance in the top electrode 16 of the FBAR of the modification of the third embodiment, a higher electromechanical coupling factor $k_t^2$ and a higher Q-value is further effectively achieved.

Figure 12A:
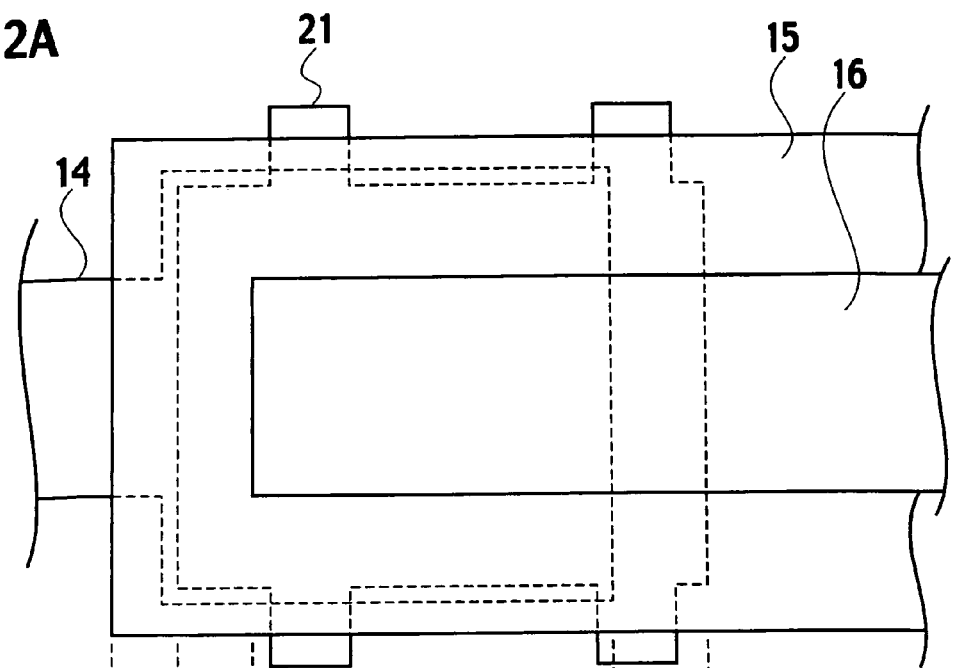
FIG. 12A is a subsequent process flow plan view showing the intermediate product of the FBAR according to the third embodiment, after the process stage shown in FIG. 11A.
Figure 12B:
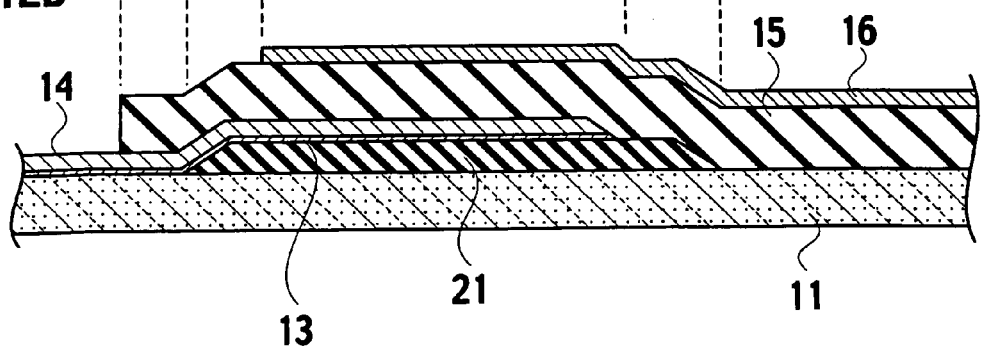
FIG. 12B is a subsequent process flow cross sectional view showing the intermediate product of the FBAR according to the third embodiment, after the process stage shown in FIG. 11B.

A manufacturing method of the FBAR of the modification of the third embodiment is such that in a sequence of manufacturing processes shown in FIG. 12B, a piezoelectric thin film is delineated by photolithography and an accompanying RIE method with chloride based etching gas so that a pattern of the piezoelectric layer 15 is formed into a rectangular pattern as shown in FIG. 13A. And afterwards, a metallic film having about 150 to 600 nm film thickness, or preferably about 250 to 350 nm film thickness, is deposited so that the metallic film can cover entire surfaces of the top electrode 16, the piezoelectric layer 15 laid bare from the edge of the top electrode 16 and the bottom electrode 14 laid bare from the edge of the piezoelectric layer 15. Afterwards the metallic film is delineated by photolithography and selectively etched so as to form patterns of the top electrode wiring 46 and the bottom electrode wiring 17. In the case where using an Al film for the metallic film and an AlN film for the piezoelectric layer 15, the Al film is selectively etched by wet etching using a non-oxidizing acid solution such as HCl solution, so as to form patterns of the top electrode wiring 46 and the bottom electrode wiring 17. Through the process, the bottom electrode wiring 17 is electrically connected to the bottom electrode 14 laid bare from the edge of the piezoelectric layer 15, and the top electrode wiring 46 is electrically connected to the top electrode 16.

Although the lower amorphous underlying layer 13 is directly provided on the substrate 11 in FIG. 13B, an insulating film 12 may be inserted between the lower amorphous underlying layer 13 and the substrate 11 similar to the configurations explained in the first and second embodiments. In this further modified case, in the remaining area not occupied by the pattern of a double layer implemented by the bottom electrode 14 and the lower amorphous underlying layer 13 in the plan view shown in FIG. 13A, the piezoelectric thin film 15 is directly provided on the insulating film 12 in the remaining area.

Fourth Embodiment

Figure 14:
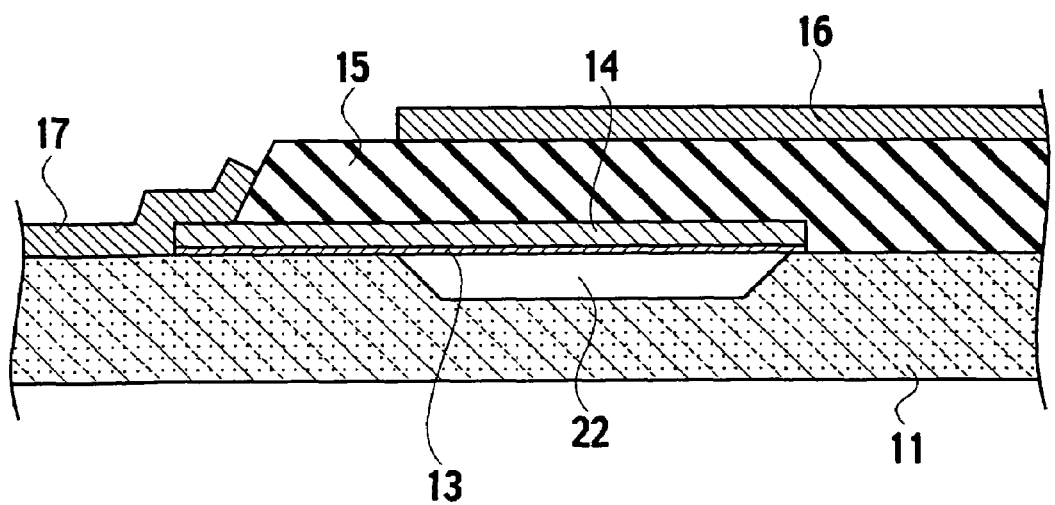
FIG. 14 is a schematic cross sectional view of the FBAR according to a fourth embodiment of the present invention, corresponding to the similar cross-sectional view taken on line IB-IB in FIG. 1A, the similar cross-sectional view taken on line DXB-DXB in FIG. 9A or the similar cross-sectional view taken on line XIVB-XIVB in FIG. 13A.

As shown in FIG. 14, a FBAR according to a fourth embodiment of the present invention encompasses a substrate 11, a cavity (hollow) 22 having a bathtub-shaped (reverse trapezoid) configuration, formed in and at the top surface of the substrate 11, a bottom electrode 14 provided on the top surface of the substrate 11, part of the bottom electrode 14 is mechanically suspended above the cavity 22, a piezoelectric layer 15 provided on the bottom electrode 14, a top electrode 16 provided on the piezoelectric layer 15 and the bottom electrode wiring 17 electrically connected to the bottom electrode 14. FIG. 14 shows a cross-sectional view of the FBAR of the fourth embodiment, and a plan view of the FBAR of the fourth embodiment is omitted since the plan view is similar to FIG. 9A. Namely, as shown in FIG. 9A, part of the boundary of the area occupied by the piezoelectric layer 15 crosses a top surface of the bottom electrode 14 and part of the bottom electrode 14 extends to the outside of the occupied area by the piezoelectric layer 15, from a boundary of the piezoelectric layer 15. And similar to the FBARs according to the first to third embodiments, the FBAR of the fourth embodiment utilizes bulk vibration along the thickness direction of the piezoelectric layer 15. The top electrode 16 has aligned crystal axes oriented along the thickness direction of the piezoelectric layer 15. The orientations of the crystal axes in the top electrode 16 along the peak crystal axis is set such that the FWHM of distribution of the orientations in the top electrode 16 along the peak crystal axis is smaller than or equal to about six degrees, or preferably smaller than or equal to about four degrees, and more preferably smaller than or equal to about three degrees. Since the smaller the FWHM is, the higher the crystallographic quality of the top electrode 16, a higher electromechanical coupling factor $k_t^2$ and a higher Q-value can be achieved.

And as shown in a cross sectional view of FIG. 14, the cavity 22 is a quasi-closed cavity, or a partially closed hollow formed into a reverse trapezoid, having a downwards convex configuration. A lower amorphous underlying layer 13 is provided along the bottom surface of the bottom electrode 14 laid bare by the cavity 22 and inserted between the bottom surface of the bottom electrode 14 and the top surface of the substrate 11. The remaining area not occupied by the pattern of a double layer implemented by the bottom electrode 14 and the lower amorphous underlying layer 13 in a plan view, the piezoelectric thin film 15 is directly provided on the substrate 11 in the remaining area. The lower amorphous underlying layer 13 is formed of materials such as a Ta—Al alloy film and a $TiB_2$ film having about five to 100 nm film thickness, or preferably about 15 to 30 nm film thickness. Then, part of the bottom surface (belly) of a double-layer structure implemented by the bottom electrode 14 and the lower amorphous underlying layer 13, is laid bare on the cavity 22 of bathtub-shaped (reverse trapezoid) configuration so that the part of the double-layer structure is suspended above the reverse trapezoidal cavity 22.

Similar to the FBARs of the first to third embodiments, it is preferable that the top electrode 16 of the FBAR according to the fourth embodiment may be mainly formed of metallic materials having about 600 to 2300 degrees C. melting point. Especially, when the main constituent of the top electrode 16 is formed of metallic materials having melting points in the range from about 600 to 2300 degrees C. with bulk resistivity smaller than and equal to about 15 micro-ohm-centimeters, the increase in resistivity due to the crystal defects is negligible, because the melting points of the metallic materials are high enough so as to ensure a high crystallographic quality. And, surface morphology becomes excellent in the process of thin film fabrication due to the high melting point. More specifically, it is preferable that the electrode material for the top electrode 16 is selected from the group consisting of Co and Ru having <0001> orientation, or alternatively, Al, Cr, Fe, Ni, Cu, Pt, Rh and Pd having <111> orientation. Although the elastic constant and the acoustic impedance of the above-listed metallic materials are lower, compared with refractory metals such as Mo, W and Ir lying out of the melting point range from about 600 to 2300 degrees C., because the orientations of the crystal axes in the top electrode 16 of the FBAR according to the fourth embodiment, can be easily aligned along a specific direction such that the FWHM in the distribution of the orientations in the top electrode 16 along the peak crystal axis is smaller than or equal to about six degrees, the elastic constant of the top electrode 16 becomes maximum along the specific direction, so as to suppress the decrease in the electromechanical coupling factor $k_t^2$ of the top electrode 16. As explained in the BAR of the first embodiment, if metallic thin films for the top electrode 16, formed of metallic materials lying in the melting point range from about 600 to 2300 degrees C., are grown at the same growth temperature, the lower the melting point of material, the larger the grain size of the metallic thin film. Therefore, a high crystallographic quality of the top electrode 16 can be achieved and a resistivity of the metallic thin film becomes approximately equivalent to the resistivity of bulk, by adopting the metallic materials having a melting point of about 600 to 2300 degrees C. In other words, by selecting the metallic materials with a melting point of about 600 to 2300 degrees C. for the materials of the top electrode 16, the grain size of the top electrode 16 becomes large and the scattering of carriers by the grain boundary is decreased. Also, since a high crystallographic quality of the top electrode 16 is achieved, the scattering of carriers by crystal defects of the metallic thin film can be decreased. As the resistivity and the series resistance in the top electrode 16 of the FBAR is decreased, the electromechanical coupling factor $k_t^2$ and the Q-value increase.

In this manner, in the FBAR according to the fourth embodiment, by selecting the metallic materials having a melting point of about 600 to 2300 degrees C. for the top electrode 16, and by orientating the top electrode 16 in a direction along which the elastic constant of the top electrode 16 increases most, acoustic impedance increases, which can prevent the bulk vibration of the piezoelectric layer 15 from propagating to the top electrode 16. Further, since the series resistance in the top electrode 16 is decreased, the FBAR having a high Q-value and a high effective electromechanical coupling factor $k_t^2$ can be achieved. And note that the above-explanations were made with regard to the top electrode 16, the same explanations will be applied to the bottom electrode 14 in theory.

With reference to FIGS. 15A to 15D, a sequence of manufacturing processes of the FBAR according to the fourth embodiment is explained. Note that the FBAR of the fourth embodiment can be manufactured by various manufacturing methods such as a modification of the fourth embodiment, other than the sequence of manufacturing processes disclosed by the following example.

Figure 15A:
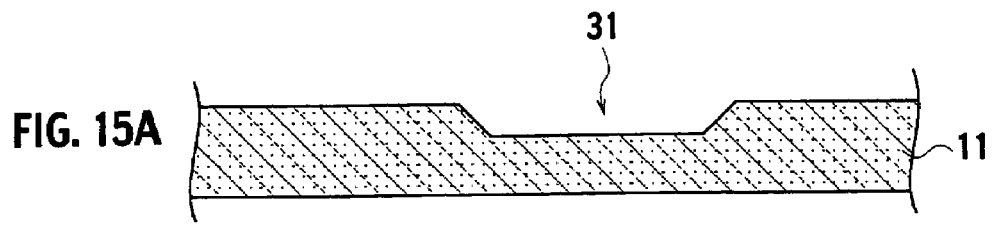
FIG. 15A is a process flow cross sectional view showing an intermediate product of the FBAR corresponding to the cross sectional view taken on line IB-IB in FIG. 1A, the similar cross-sectional view taken on line DXB-DXB in FIG. 9A or the similar cross-sectional view taken on line XIVB-XIVB in FIG. 13A, explaining a manufacturing method of the FBAR according to the fourth embodiment.

(a) First, as shown in FIG. 15A, on a Si (100) substrate 11, a hollow 31 having about 0.5 to two micrometers depth, or preferably about 0.8 to 1.5 micrometers depth, is formed by photolithography with fluoride based etching gas. Similar to FIG. 10A, a plan view of the hollow 31 is a rectangular pattern in which branch members of striped configuration are established so that the branch members of striped configuration are orthogonal to the sides of the rectangular pattern, although the plan view is omitted. A topology of the hollow 31 corresponds to the topology in which the sacrificial layer 21 shown in FIG. 10 turns reverse. The number of branch members may be arbitrarily selected.

Figure 15B:
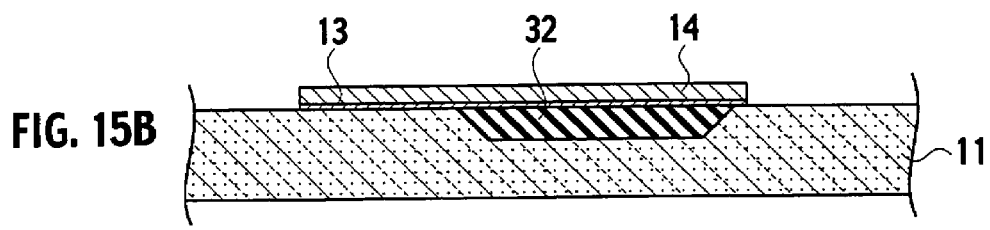
FIG. 15B is a subsequent process flow cross sectional view showing the intermediate product of the FBAR according to the fourth embodiment after the process stage shown in FIG. 15A.
Figure 15C:
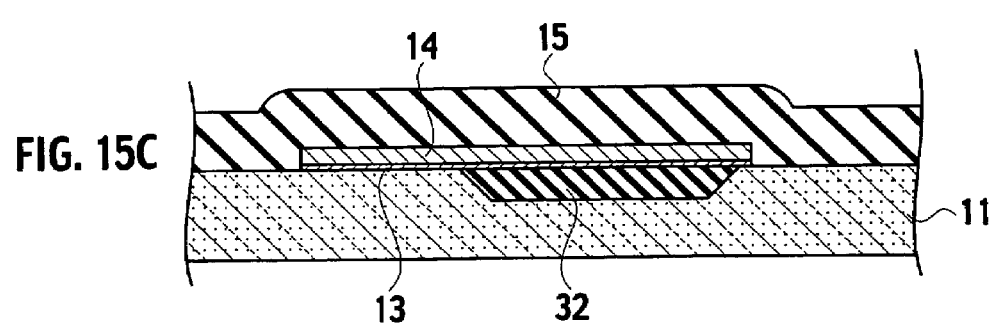
FIG. 15C is a subsequent process flow cross sectional view showing the intermediate product of the FBAR according to the fourth embodiment, after the process stage shown in FIG. 15B.

(b) For instance, when the hollow 31 has a one micrometer depth, a boro-phosphate-silicate-glass (BPSG) film, having an about 1.2 micrometers film thickness is deposited by chemical vapor deposition (CVD) method on the hollow 31, and the BPSG film is planarized by chemical mechanical polishing (CMP) method so as to form a pattern of a sacrificial layer 32. A plan view of the sacrificial layer 32 is a similar rectangular pattern to the plan view of the hollow 31, in which branch members of striped configuration are established so that the branch members of striped configuration are orthogonal to the sides of the rectangular pattern. Next, on entire surfaces of the sacrificial layer 32 and the Si substrate 11 which surrounds the perimeter of the sacrificial layer 32, a first amorphous thin film (mother material metallic film for the lower amorphous underlying layer) 13 having about five to 100 nm film thickness, or preferably about ten to 30 nm film thickness, and a metallic film (a mother material metallic film for the bottom electrode) 14 such as an Al film, having about 150 to 600 nm film thickness, or preferably about 250 to 350 nm film thickness, are deposited successively. The first amorphous thin film 13 and the first metallic film 14 can be deposited successively in the same deposition-chamber. And the first amorphous thin film 13 and the first metallic film 14 are delineated and selectively etched by photolithography and an accompanying RIE method so as to form a pattern of a double layer implemented by the bottom electrode 14 and the lower amorphous underlying layer 13 under the bottom electrode 14 as shown in FIG. 15B.

(c) Afterwards, on entire surfaces of the bottom electrode 14 and the Si substrate, a piezoelectric thin film, having a wurtzite lattice structure with about 0.5 to three micrometers thickness is deposited by RF magnetron sputtering method, etc. The thickness of the piezoelectric thin film varies by resonance frequencies, and the thickness of the mother material film may be determined at about 1.6 micrometers, if the piezoelectric thin film is AlN and if the resonance frequency is designed to be about 1.9 GHz.

Figure 15D:
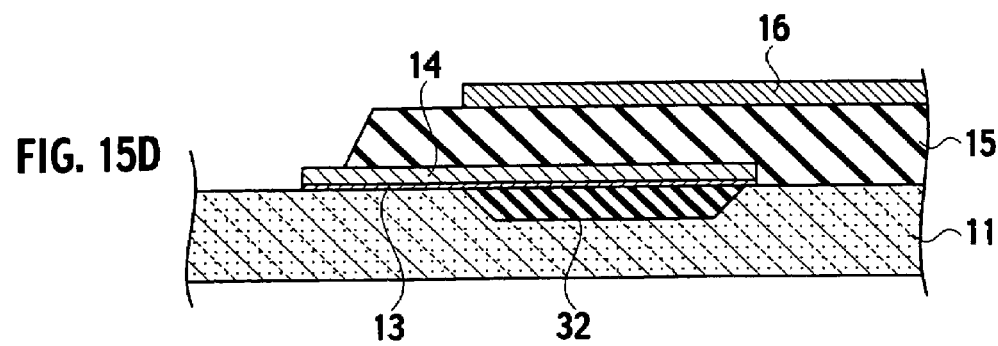
FIG. 15D is a further subsequent process flow cross sectional view showing the intermediate product of the FBAR according to the fourth embodiment after the process stage shown in FIG. 15C.

(d) Further, on the piezoelectric thin film, a metallic film (a mother material metallic film for the top electrode) 16 having about 150 to 600 nm film thickness, or preferably about 250 to 350 nm film thickness, is deposited successively. For instance, a Co film for the second metallic Mm 16 having about 300 nm film thickness and the piezoelectric thin film 15 can be deposited successively in the same deposition chamber (vacuum chamber) of the same fabrication tool (sputtering tool) without exposure to the air. Subsequently, the Co film (second metallic film) 16 is delineated and selectively etched by photolithography and an accompanying RIE method so as to form a pattern of the top electrode 16 as shown in FIG. 11B. Then, afterwards, the piezoelectric thin film 15 is delineated by photolithography and an accompanying RIE method with chloride based etching gas so as to form a pattern of the piezoelectric layer 15 as shown in FIG. 15D. The pattern of the piezoelectric layer 15 is delineated such that one of the end faces of the piezoelectric layer 15 is located on the bottom electrode 14, and part of the bottom electrode 14 comes to show up from the edge of the piezoelectric layer 15. Further, similar to the plan view of FIG. 12A, the branch members of striped configuration established at the sides of the rectangular pattern of the sacrificial layer 32, come to show up from the edge of the end faces of the piezoelectric layer 15.

(e) Next, the Si substrate 11 is submerged in a BPSG-etching solution such as hydrofluoric acid (HF), ammonium fluoride ($NH_4F$). By the process, the branch members of striped configuration in the rectangular pattern of the sacrificial layer 32, laid bare from the sides of the double-layer structure of the lower amorphous underlying layer 13 and the bottom electrode 14, are etched. As etching of the branch members in the striped configuration proceeds, a conduit of the etching solution to the sacrificial layer 32, which is buried under the bottom surface (belly) of the bottom electrode 14, is formed. And the sacrificial layer 32 is etched through the conduit of the etching solution, so as to form a pattern of the cavity 22 shown in FIG. 14. After the etching by the BPSG-etching solution, the Si substrate 11 is rinsed by isopropyl alcohol and dried.

As mentioned above, according to the manufacturing method of the FBAR of the fourth embodiment, since the piezoelectric thin film 15 and the second metallic film (mother material metallic film for the top electrode) 16 can be deposited successively in the same deposition chamber (vacuum chamber) of the same fabrication tool (sputtering tool) without exposure to the air, excellent morphologies at a boundary surface between the piezoelectric layer 15 and the top electrode 16 can be achieved. By the fabrication process, high crystallographic quality of the top electrode 16 is achieved which easily enables the FWHM of distribution of the orientations in the top electrode 16 along the peak crystal axis to be smaller than or equal to about six degrees. Therefore, according to the manufacturing method of the FBAR of the fourth embodiment, the FBAR having large technical advantages such that the series resistance in the electrodes is low, thin films of the electrodes are not subject to residual stress and the electromechanical coupling factor $k_t^2$ is high, can be achieved with ease.

The FBAR according to the fourth embodiment can implement the ladder-type filter 41 shown in FIG. 3 and a semiconductor integrated circuit such as the VCO of mobile communication devices shown in FIG. 4 as mentioned in the first embodiment. Also a plurality of FBARs of the fourth embodiment can be employed in the portable transceiver shown in FIG. 5 and FIG. 6, so as to implement the micro mechanical filters for the RF filter 41 and the IF filter 42.

Although the lower amorphous underlying layer 13 is directly provided on the substrate 11 in FIGS. 14, 15B, 15C and 15D, an insulating film 12 may be inserted between the lower amorphous underlying layer 13 and the substrate 11 similar to the configurations explained in the first and second embodiments. In this modified case, in the remaining area not occupied by the pattern of a double layer implemented by the bottom electrode 14 and the lower amorphous underlying layer 13 in the plan view, the piezoelectric thin film 15 is directly provided on the insulating film 12 in the remaining area.

Modification of the Fourth Embodiment

Figure 16:
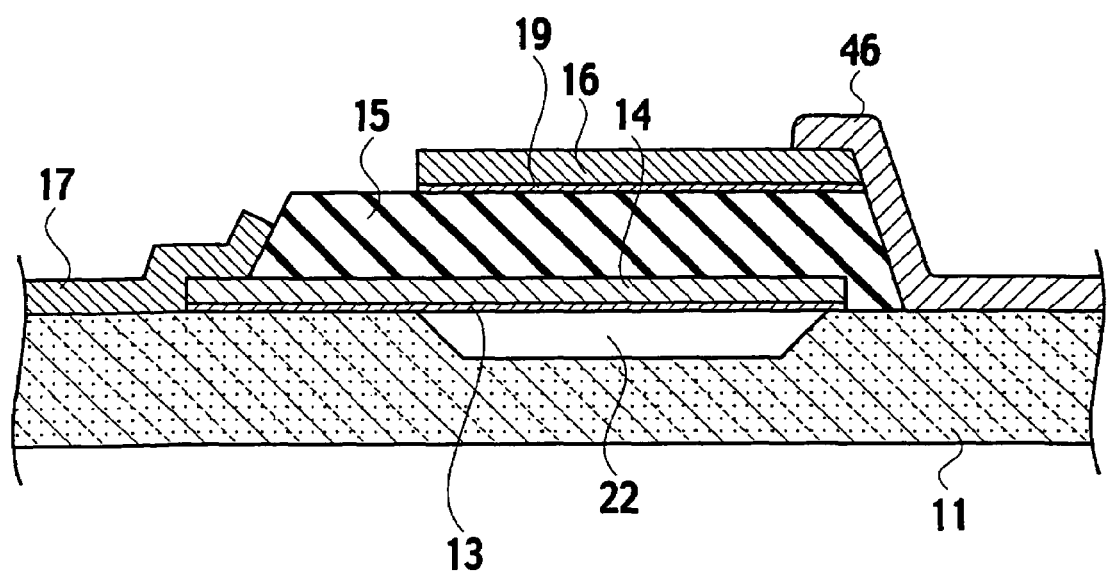
FIG. 16 is a schematic cross sectional view of the FBAR according to a modification of the fourth embodiment of the present invention.

As shown in FIG. 16, a FBAR according to a modification of the fourth embodiment of the present invention encompasses a substrate 11, a cavity (hollow) 22 having a bathtub-shaped (reverse trapezoid) configuration, formed in and at the top surface of the substrate 11, a bottom electrode 14 provided on the top surface of the substrate 11, part of the bottom electrode 14 is mechanically suspended above the cavity 22, a piezoelectric layer 15 provided on part of the bottom electrode 14, making bare other parts of the bottom electrode 14, a top electrode 16 provided on the piezoelectric layer 15, a bottom electrode wiring 17 connected to part of the bottom electrode 14 which extends to an outside of the occupied area by the piezoelectric layer 15, from a boundary of the piezoelectric layer 15 in a plan view, and a top electrode wiring 46 connected to part of the top electrode 16.

Although the FBAR of the modification of the fourth embodiment has a similar configuration to the FBAR of Mg. 14 in that a lower amorphous underlying layer (first amorphous underlying layer) 13 is provided along the bottom surface of the bottom electrode 14, the FBAR of the modification of the fourth embodiment encompasses further an upper amorphous underlying layer (second amorphous underlying layer) 19, inserted between the top surface of the piezoelectric layer 15 and the bottom surface of the top electrode 16 and formed of materials such as a Ta—Al alloy film and a $TiB_2$ film having about five to 100 nm film thickness, or preferably about 15 to 30 nm film thickness. In the FBAR of the modification of the fourth embodiment, since the upper amorphous underlying layer 19 is inserted between the top surface of the piezoelectric layer 15 and the bottom surface of the top electrode 16, the FWHM in the distribution of the orientations can be set at preferably smaller than or equal to about four degrees and more preferably smaller than or equal to about three degrees with ease.

Especially, when metallic materials having high acoustic impedance, such as a Ta—Al alloy film is inserted between the top surface of the piezoelectric layer 15 and the bottom surface of the top electrode 16, for the second amorphous thin film (mother material film for the upper amorphous underlying layer) 19, not only the orientations of the crystal axes in the top electrode 16 are improved, but also the electromechanical coupling factor $k_t^2$ is effectively increased. By making use of the multiplying effect of the decrease of the resistivity of the top electrode 16 and the decrease of the series resistance in the top electrode 16 of the FBAR of the modification of the fourth embodiment, a higher electromechanical coupling factor $k_t^2$ and a higher Q-value is further effectively achieved.

A manufacturing method of the FBAR of the modification of the fourth embodiment is such that in a sequence of manufacturing processes shown in FIG. 15D, a piezoelectric thin film is delineated by photolithography and an accompanying RIE method with chloride based etching gas so as to form a rectangular pattern as shown in FIG. 16. A plan view of the rectangular pattern of the piezoelectric layer 15 is similar to FIG. 13A, although the plan view is omitted. And afterwards, a metallic film having about 150 to 600 nm film thickness, or preferably about 250 to 350 nm film thickness, is deposited so that the metallic film can cover entire surfaces of the top electrode 16, the piezoelectric layer 15 laid bare from the edge of the top electrode 16 and the bottom electrode 14 laid bare from the edge of the piezoelectric layer 15. And the metallic film is delineated by photolithography and selectively etched so as to form patterns of the top electrode wiring 46 and the bottom electrode wiring 17. In the case where using an Al film for the metallic film and an AlN film for the piezoelectric layer 15, the Al film is selectively etched by wet etching using a non-oxidizing acid solution such as HCl solution, so as to form patterns of the top electrode wiring 46 and the bottom electrode wiring 17. Through the process, the bottom electrode wiring 17 is electrically connected to the bottom electrode 14 laid bare from the edge of the piezoelectric layer 15, and the top electrode wiring 46 is electrically connected to the top electrode 16.

Although the lower amorphous underlying layer 13 is directly provided on the substrate 11 in FIG. 16, an insulating film 12 may be inserted between the lower amorphous underlying layer 13 and the substrate 11 similar to the configurations explained in the first and second embodiments. In this further modified case, in the remaining area not occupied by the pattern of a double layer implemented by the bottom electrode 14 and the lower amorphous underlying layer 13 in a plan view, the piezoelectric thin film 15 is directly provided on the insulating film 12 in the remaining area Other Embodiments Various modifications will become possible for those skilled in the art after receiving the teaching of the present disclosure without departing from the scope thereof. For example, although in the first to fourth embodiments, the explanations were made for the structures of FBARs employing AlN for the piezoelectric thin film, because the material behavior of the AlN film has the highest matching with semiconductor manufacturing processes (LSI process), the mother material film of the piezoelectric layer is not limited to AlN and materials having wurtzite lattice structure, and any material can be employed for the piezoelectric thin film including materials of perovskite lattice structure such as lead titanate ($PbTiO_3$) and barium titanate ($BaTiO_3$).

In the first and second embodiments, although the case where an insulating film 12 is inserted between the lower amorphous underlying layer 13 and the substrate 11, the lower amorphous underlying layer 13 may be directly provided on the substrate 11 similar to the configurations explained in the third and forth embodiments. In this case, in the remaining area not occupied by the pattern of a double layer implemented by the bottom electrode 14 and the lower amorphous underlying layer 13 in a plan view, the piezoelectric thin film 15 is directly provided on the substrate 11 in the remaining area.

Thus, the present invention of course includes various embodiments and modifications and the like which are not detailed above. Therefore, the scope of the present invention will be defined in the following claims.

What is claimed is:

1. A film bulk acoustic-wave resonator, comprising:
a substrate having a cavity;
a bottom electrode partially fixed to the substrate, part of the bottom electrode is mechanically suspended above the cavity;
a piezoelectric layer provided on the bottom electrode;
a top electrode provided on the piezoelectric layer having crystal axes oriented along a thickness direction of the piezoelectric layer, a full width at half maximum of the distribution of the orientations of the crystal axes is smaller than or equal to about six degrees; and
an upper amorphous underlying layer inserted between the piezoelectric layer and the top electrode,
wherein the main constituent of the upper amorphous underlying layer is formed of a metallic material selected from the group consisting of aluminum-tantalum alloy and titanium-boride.

2. The film bulk acoustic-wave resonator of claim 1, wherein the main constituent of the top electrode is formed of a metallic material having a melting point in the range from about 600 to 2300 degrees C and a bulk resistivity smaller than or equal to about 15 micro-ohm-centimeters.

3. The film bulk acoustic-wave resonator of claim 1, wherein the main constituent of the top electrode is formed of a metallic material selected from the group consisting of:
cobalt having <0001> orientation;
ruthenium having <0001> orientation;
aluminum having <111> orientation;
chromium having <111> orientation;
iron having <111> orientation;
nickel having <111> orientation;
copper having <111> orientation;
platinum having <111> orientation;
rhodium having <111> orientation; and
palladium having <111> orientation.

4. A film bulk acoustic-wave resonator, comprising:
a substrate having a cavity;
a bottom electrode partially fixed to the substrate, part of the bottom electrode is mechanically suspended above the cavity;
a piezoelectric layer provided on the bottom electrode;
a top electrode provided on the piezoelectric layer having crystal axes oriented along a thickness direction of the piezoelectric layer, a full width at half maximum of the distribution of the orientations of the crystal axes is smaller than or equal to about six degrees; and
a lower amorphous underlying layer inserted between the bottom electrode and the substrate,
wherein the main constituent of the lower amorphous underlying layer is formed of a metallic material selected from the group consisting of aluminum-tantalum alloy and titanium-boride.

5. The film bulk acoustic-wave resonator of claim 4, further comprising an insulating film inserted between the substrate and the lower amorphous underlying layer.

6. The film bulk acoustic-wave resonator of claim 4, wherein the main constituent of the top electrode is formed of a metallic material having a melting point in the range from about 600 to 2300 degrees C and a bulk resistivity smaller than or equal to about 15 micro-ohm-centimeters.

7. The film bulk acoustic-wave resonator of claim 4, wherein the main constituent of the top electrode is formed of a metallic material selected from the group consisting of:
cobalt having <0001> orientation;
ruthenium having <0001> orientation;
aluminum having <111> orientation;

chromium having <111> orientation;
iron having <111> orientation;
nickel having <111> orientation;
copper having <111> orientation;
platinum having <111> orientation;
rhodium having <111> orientation; and
palladium having <111> orientation.

8. A filter formed on a substrate having first, second and third cavities, connected between first and second ports, the first port being specified by first and second nodes and the second port being specified by third and fourth nodes, the filter comprising:

a first film bulk acoustic-wave resonator comprising:
- a first bottom electrode connected to the first node, partially fixed to the substrate, part of the first bottom electrode is mechanically suspended above the first cavity;
- a first piezoelectric layer provided on the first bottom electrode;
- a first top electrode provided on the first piezoelectric layer; and
- a first upper amorphous underlying layer inserted between the first piezoelectric layer and the first top electrode;

a second film bulk acoustic-wave resonator comprising:
- a second bottom electrode connected to the second and fourth nodes, partially fixed to the substrate, part of the second bottom electrode is mechanically suspended above the second cavity;
- a second piezoelectric layer provided on the second bottom electrode;
- a second top electrode connected to the first top electrode so as to form a common top electrode, provided on the second piezoelectric layer; and
- a second upper amorphous underlying layer inserted between the second piezoelectric layer and the second top electrode; and a third film bulk acoustic-wave resonator comprising:
- a third bottom electrode connected to the common top electrode, partially fixed to the substrate, part of the third bottom electrode is mechanically suspended above the third cavity;
- a third piezoelectric layer provided on the third bottom electrode;
- a third top electrode connected to the third node, provided on the third piezoelectric layer; and
- a third upper amorphous underlying layer inserted between the third piezoelectric layer and the third top electrode, wherein the first, second and third top electrodes have crystal axes oriented along thickness directions of the first, second and third piezoelectric layers respectively, a full width at half maximum of the distribution of the orientations of the crystal axes is smaller than or equal to about six degrees, and the main constituent of the first, second and third upper amorphous underlying layers is formed of a metallic material selected from the group consisting of aluminum-tantalum alloy and titanium-boride.

9. The film bulk acoustic-wave resonator of claim 8, wherein the main constituent of the first, second and third top electrodes is formed of a metallic material having a melting point in the range from about 600 to 2300 degrees C and a bulk resistivity smaller than or equal to about 15 micro-ohm-centimeters.

10. A filter formed on a substrate having first, second and third cavities, connected between first and second ports, the first port being specified by first and second nodes and the second port being specified by third and fourth nodes, the filter comprising:

a first film bulk acoustic-wave resonator comprising:
- a first bottom electrode connected to the first node, partially fixed to the substrate, part of the first bottom electrode is mechanically suspended above the first cavity;
- a first piezoelectric layer provided on the first bottom electrode;
- a first top electrode provided on the first piezoelectric layer; and
- a first lower amorphous underlying layer inserted between the first bottom electrode and the substrate;

a second film bulk acoustic-wave resonator comprising:
- a second bottom electrode connected to the second and fourth nodes, partially fixed to the substrate, part of the second bottom electrode is mechanically suspended above the second cavity;
- a second piezoelectric layer provided on the second bottom electrode;
- a second top electrode connected to the first top electrode so as to form a common top electrode, provided on the second piezoelectric layer; and
- a second lower amorphous underlying layer inserted between the second bottom electrode and the substrate; and a third film bulk acoustic-wave resonator comprising:
- a third bottom electrode connected to the common top electrode, partially fixed to the substrate, part of the third bottom electrode is mechanically suspended above the third cavity;
- a third piezoelectric layer provided on the third bottom electrode;
- a third top electrode connected to the third node, provided on the third piezoelectric layer; and
- a third lower amorphous underlying layer inserted between the third bottom electrode and the substrate, wherein the first, second and third top electrodes have crystal axes oriented along thickness directions of the first, second and third piezoelectric layers respectively, a full width at half maximum of the distribution of the orientations of the crystal axes is smaller than or equal to about six degrees, and the main constituent of the first, second and third lower amorphous underlying layers is formed of a metallic material selected from the group consisting of aluminum-tantalum alloy and titanium-boride.

11. The film bulk acoustic-wave resonator of claim 10, wherein the main constituent of the first, second and third top electrodes is formed of a metallic material having a melting point in the range from about 600 to 2300 degrees C and a bulk resistivity smaller than or equal to about 15 micro-ohm-centimeters.

* * * * *